US008760863B2

(12) United States Patent
Campbell et al.

(10) Patent No.: US 8,760,863 B2
(45) Date of Patent: Jun. 24, 2014

(54) MULTI-RACK ASSEMBLY WITH SHARED COOLING APPARATUS

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 13/285,105

(22) Filed: Oct. 31, 2011

(65) Prior Publication Data

US 2013/0107447 A1 May 2, 2013

(51) Int. Cl.
*H05K 5/00* (2006.01)
*H05K 7/20* (2006.01)
*G06F 1/20* (2006.01)

(52) U.S. Cl.
USPC ............... 361/679.5; 361/600; 361/679.01; 361/679.02; 361/679.46; 361/679.47; 361/679.49

(58) Field of Classification Search
USPC ........... 700/300; 361/679.57, 679.46, 679.49, 361/679.51, 679.52, 679.5
See application file for complete search history.

(56) References Cited

U.S. PATENT DOCUMENTS

| 3,317,798 A | 5/1967 | Chu et al. |
| 3,754,596 A | 8/1973 | Ward, Jr. |
| 4,108,240 A | 8/1978 | Margen et al. |

(Continued)

FOREIGN PATENT DOCUMENTS

| DE | 19845821 B4 | 4/2000 |
| GB | 2436669 B | 5/2011 |
| WO | WO 97/47167 A1 | 12/1997 |
| WO | WO 02/37918 A1 | 5/2002 |

OTHER PUBLICATIONS

Delia et al., "System Cooling Design for the Water-Cooled IBM Enterprise System/900 Processors", IBM Journal of Research and Development, vol. 36, No. 4, pp. 791-803 (Jul. 1992).

(Continued)

*Primary Examiner* — Lisa Lea Edmonds
*Assistant Examiner* — Keith Depew
(74) *Attorney, Agent, or Firm* — Dennis Jung, Esq.; Kevin P. Radigan, Esq.; Heslin Rothenberg Farley & Mesiti P.C.

(57) ABSTRACT

A multi-rack assembly is provided which includes adjacent first and second electronics racks, each being at least partially air-cooled, and an air-to-liquid heat exchanger associated with the first rack for cooling at least a portion of air passing through the first rack. The heat exchanger, which is disposed at the air inlet or air outlet side of the first rack and is coupled in fluid communication with a coolant loop to receive coolant from the loop and exhaust coolant to the loop, transfers heat from air passing thereacross to coolant passing therethrough. The assembly also includes a cooling unit, associated with the first rack and cooling coolant in the coolant loop, and an airflow director associated with the second rack and facilitating ducting at least a portion of air passing through the second rack to also pass across the heat exchanger associated with the first rack.

18 Claims, 23 Drawing Sheets

(56) References Cited

U.S. PATENT DOCUMENTS

| | | | |
|---|---|---|---|
| 5,150,277 A | 9/1992 | Bainbridge et al. | |
| 5,198,962 A | 3/1993 | Tyson | |
| 5,228,197 A | 7/1993 | Cox et al. | |
| 5,467,250 A | 11/1995 | Howard et al. | |
| 5,467,609 A | 11/1995 | Feeney | |
| 5,752,011 A | 5/1998 | Thomas et al. | |
| 5,974,557 A | 10/1999 | Thomas et al. | |
| 6,012,220 A | 1/2000 | Cornejo | |
| 6,164,369 A | 12/2000 | Stoller | |
| 6,349,391 B1 | 2/2002 | Petivan et al. | |
| 6,374,627 B1 | 4/2002 | Schumacher et al. | |
| 6,494,050 B2 | 12/2002 | Spinazzola et al. | |
| 6,535,798 B1 | 3/2003 | Bhatia et al. | |
| 6,587,343 B2 | 7/2003 | Novotny et al. | |
| 6,704,198 B2 | 3/2004 | Replogle et al. | |
| 6,763,880 B1 | 7/2004 | Shih | |
| 6,807,056 B2 | 10/2004 | Kondo et al. | |
| 6,819,563 B1 | 11/2004 | Chu et al. | |
| 6,854,284 B2 | 2/2005 | Bash et al. | |
| 6,854,287 B2 | 2/2005 | Patel et al. | |
| 6,867,970 B2 | 3/2005 | Muller et al. | |
| 6,896,612 B1 | 5/2005 | Novotny | |
| 6,924,981 B2 | 8/2005 | Chu et al. | |
| 6,927,980 B2 | 8/2005 | Fukuda et al. | |
| 6,968,709 B2 | 11/2005 | Goth et al. | |
| 6,973,801 B1 | 12/2005 | Campbell et al. | |
| 6,997,006 B2 | 2/2006 | Kameyama et al. | |
| 7,002,799 B2 | 2/2006 | Malone et al. | |
| 7,011,143 B2 | 3/2006 | Corrado et al. | |
| 7,086,247 B2 | 8/2006 | Campbell et al. | |
| 7,106,590 B2 | 9/2006 | Chu et al. | |
| 7,110,260 B2 | 9/2006 | Weber et al. | |
| 7,219,247 B2 | 5/2007 | Law et al. | |
| 7,236,363 B2 | 6/2007 | Belady | |
| 7,312,993 B2 | 12/2007 | Bundza et al. | |
| 7,315,448 B1 | 1/2008 | Bash et al. | |
| 7,342,789 B2 | 3/2008 | Hall et al. | |
| 7,385,810 B2 * | 6/2008 | Chu et al. | 361/679.48 |
| 7,400,505 B2 | 7/2008 | Campbell et al. | |
| 7,436,666 B1 | 10/2008 | Konshak | |
| 7,477,514 B2 | 1/2009 | Campbell et al. | |
| 7,486,513 B2 | 2/2009 | Hall et al. | |
| 7,639,486 B2 | 12/2009 | Champion et al. | |
| 7,641,101 B2 | 1/2010 | Campbell et al. | |
| 7,647,787 B2 | 1/2010 | Belady et al. | |
| 7,657,347 B2 | 2/2010 | Campbell et al. | |
| 7,660,109 B2 | 2/2010 | Iyengar et al. | |
| 7,660,116 B2 | 2/2010 | Claassen et al. | |
| 7,660,117 B2 | 2/2010 | Werner et al. | |
| 7,660,121 B2 | 2/2010 | Campbell et al. | |
| 7,701,714 B2 | 4/2010 | Shabany | |
| 7,716,939 B1 | 5/2010 | Morales | |
| 7,757,506 B2 | 7/2010 | Ellsworth, Jr. et al. | |
| 7,788,940 B2 | 9/2010 | Madara et al. | |
| 7,808,780 B2 | 10/2010 | Brunschwiler et al. | |
| 7,878,889 B2 | 2/2011 | Day | |
| 7,885,070 B2 | 2/2011 | Campbell et al. | |
| 7,903,404 B2 | 3/2011 | Tozer et al. | |
| 7,903,407 B2 | 3/2011 | Matsushima et al. | |
| 7,907,406 B1 | 3/2011 | Campbell et al. | |
| 7,907,409 B2 | 3/2011 | Wyatt et al. | |
| 7,963,119 B2 | 6/2011 | Campbell et al. | |
| 8,248,793 B2 * | 8/2012 | Bash et al. | 361/695 |
| 8,248,801 B2 | 8/2012 | Campbell et al. | |
| 8,295,047 B1 | 10/2012 | Hamburgen et al. | |
| 2004/0221604 A1 | 11/2004 | Ota et al. | |
| 2005/0061541 A1 | 3/2005 | Belady | |
| 2005/0237714 A1 | 10/2005 | Ebermann | |
| 2006/0002086 A1 | 1/2006 | Teneketges et al. | |
| 2006/0037736 A1 | 2/2006 | Heyman | |
| 2006/0065000 A1 | 3/2006 | Belady | |
| 2006/0139877 A1 | 6/2006 | Germagian et al. | |
| 2007/0101334 A1 | 5/2007 | Atyam et al. | |
| 2007/0119569 A1 | 5/2007 | Campbell et al. | |
| 2007/0227709 A1 | 10/2007 | Upadhya et al. | |
| 2007/0227710 A1 | 10/2007 | Belady et al. | |
| 2008/0037217 A1 | 2/2008 | Murakami et al. | |
| 2008/0123288 A1 | 5/2008 | Hillis | |
| 2008/0148746 A1 | 6/2008 | Yanik et al. | |
| 2008/0198549 A1 | 8/2008 | Rasmussen et al. | |
| 2008/0232064 A1 * | 9/2008 | Sato et al. | 361/687 |
| 2008/0245083 A1 | 10/2008 | Tutunoglu et al. | |
| 2009/0080173 A1 | 3/2009 | Porter et al. | |
| 2009/0086428 A1 | 4/2009 | Campbell et al. | |
| 2009/0086432 A1 | 4/2009 | Campbell et al. | |
| 2009/0122483 A1 | 5/2009 | Hall | |
| 2009/0126909 A1 | 5/2009 | Ellsworth, Jr. et al. | |
| 2009/0133866 A1 | 5/2009 | Campbell et al. | |
| 2009/0156114 A1 | 6/2009 | Ahladas et al. | |
| 2009/0207567 A1 | 8/2009 | Campbell et al. | |
| 2009/0225514 A1 | 9/2009 | Correa et al. | |
| 2009/0241578 A1 | 10/2009 | Carlson et al. | |
| 2009/0260384 A1 | 10/2009 | Champion et al. | |
| 2010/0033931 A1 | 2/2010 | Miyazawa et al. | |
| 2010/0053879 A1 | 3/2010 | Miyamoto et al. | |
| 2010/0067193 A1 | 3/2010 | Arimilli et al. | |
| 2010/0078160 A1 | 4/2010 | Novotny et al. | |
| 2010/0101759 A1 | 4/2010 | Campbell et al. | |
| 2010/0263855 A1 * | 10/2010 | Arimilli et al. | 165/288 |
| 2011/0051372 A1 * | 3/2011 | Barringer et al. | 361/701 |
| 2011/0056675 A1 | 3/2011 | Barringer et al. | |
| 2011/0060470 A1 | 3/2011 | Campbell et al. | |
| 2011/0205705 A1 | 8/2011 | Graybill et al. | |
| 2011/0277967 A1 | 11/2011 | Fried et al. | |
| 2013/0104383 A1 | 5/2013 | Campbell et al. | |
| 2013/0104399 A1 | 5/2013 | Campbell et al. | |
| 2013/0105139 A1 | 5/2013 | Campbell et al. | |

OTHER PUBLICATIONS

Nelson et al. "Thermal Performance of an Integral Immersion Cooled Multichip Module Package", IEEE on Components, Packages, and Manufacturing Technology—Part A, vol. 17, No. 3, pp. 405-412 (Sep. 1994).

Arent, "Liquid Coolant Distribution Unit with Convertible Air or Water Cooling", IBM Technical Disclosure Bulletin, IP Prior Art Database, IP.com No. IPCOM000044828D (Feb. 6, 2005).

Morgan, "IBM Hints at Triple Redundancy in Power6", (http://www.itjungle.com/breaking/bn032906-story-1.html) (Mar. 29, 2006).

Ellsworth, Jr. et al., "The Evolution of Water Cooling for IBM Larger Server Systems: Back to the Future", IEEE, Piscataway, NJ, 2008 11th Intersociety Conference on Thermal and Thermomechanical Phenomena in Electronic Systems (ITHERM '08), pp. 266-274 (May 2008).

Campbell et al. "Automatically Reconfigurable Liquid-Cooling Apparatus for an Electronics Rack", U.S. Appl. No. 12/947,302, filed Nov. 16, 2010.

Eckberg et al. "Multi-Rack, Door-Mounted Heat Exchanger", U.S. Appl. No. 13/115,404, filed May 25, 2011.

Search Report issued by the Great Britain Intellectual Property Office (IPO) for GB Application No. 1216992.6, dated Jan. 18, 2013.

Campbell et al., Office Action for U.S. Appl. No. 13/684,736, filed Nov. 26, 2012 (U.S. Patent Publication No. 2013/0104399 A1), dated Jul. 23, 2013 (31 pgs.).

Campbell et al., Notice of Allowance for U.S. Appl. No. 13/285,116, filed Oct. 31, 2011 (U.S. Patent Publication No. 2013/0105139 A1), dated Dec. 24, 2013 (9 pages).

Campbell et al., Notice of Allowance for U.S. Appl. No. 13/684,753, filed Nov. 26, 2012 (U.S. Patent Publication No. 2013/0104383 A1), dated Mar. 27, 2014 (9 pages).

* cited by examiner

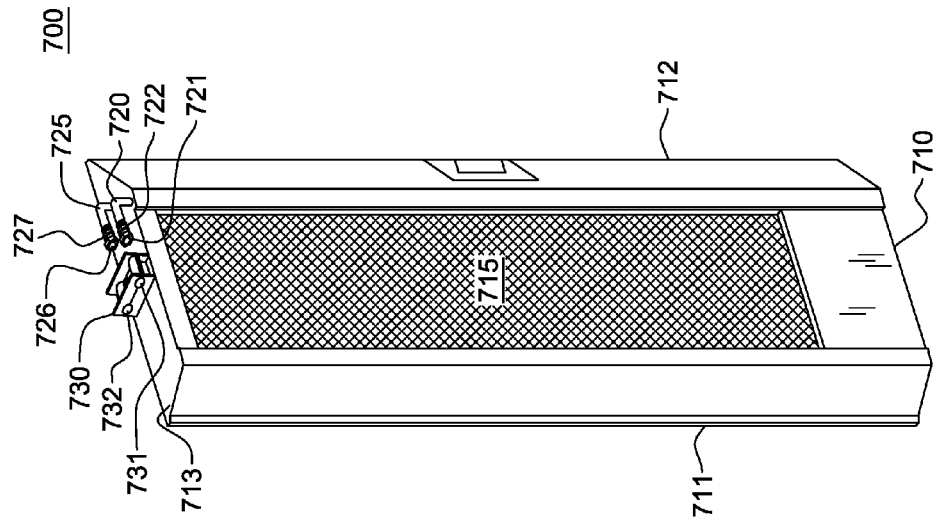
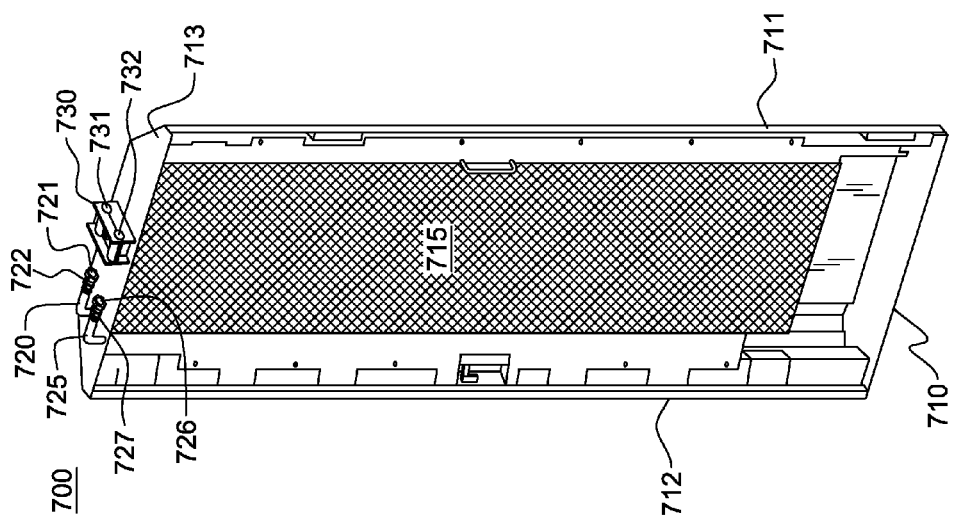

US 8,760,863 B2

MULTI-RACK ASSEMBLY WITH SHARED COOLING APPARATUS

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device. However, this approach is becoming problematic at the rack level in the context of a computer installation (i.e., data center).

The sensible heat load carried by the air exiting the rack is stressing the capability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment, whether to air or other liquid.

BRIEF SUMMARY

The shortcomings of the prior art are overcome and additional advantages are provided through the provision of a multi-rack assembly. The multi-rack assembly includes a first electronics rack, a second electronics rack, an air-to-liquid heat exchanger, at least one cooling unit, and an airflow director. Each electronics rack is at least partially air-cooled and has an air inlet side and an air outlet side. The first electronics rack and the second electronics rack are disposed adjacent to each other, with at least one of the air inlet sides facing a first direction or the air outlet sides facing a second direction. The air-to-liquid heat exchanger is associated with the first electronics rack for cooling at least a portion of air passing through the first electronics rack, and is disposed at one of the air inlet side or the air outlet side of the first electronics rack. The heat exchanger, which is coupled in fluid communication with a coolant loop to receive coolant therefrom and exhaust coolant thereto, transfers heat from air passing thereacross to coolant passing therethrough. The at least one cooling unit is associated with the first electronics rack and cools coolant in the coolant loop to, at least in part, facilitate extraction of heat by the air-to-liquid heat exchanger from the air passing thereacross. The airflow director is associated with the second electronics rack and facilitates ducting at least a portion of air passing through the second electronics rack to also pass across the air-to-liquid heat exchanger associated with the first electronics rack.

In another aspect, a data center is provided which includes a first electronics rack, a second electronics rack, a cooling apparatus associated with the first electronics rack, an airflow director associated with the second electronics rack, and at least one facility coolant loop. The first electronics rack and second electronics rack each comprise an air inlet side and an air outlet side respectively enabling ingress and egress of external air, and the second electronics rack is disposed adjacent to the first electronics rack. The cooling apparatus facilitates extraction of heat from airflow passing through the first electronics rack, and includes an air-to-liquid heat exchanger, and at least one cooling unit. The air-to-liquid heat exchanger is associated with the first electronics rack for cooling at least a portion of air passing through the first electronics rack, and is disposed at one of the air inlet side or air outlet side of the first electronics rack. The air-to-liquid heat exchanger is coupled in fluid communication with a coolant loop to receive coolant therefrom and exhaust coolant thereto, and transfers heat from air passing across the air-to-liquid heat exchanger to coolant passing through the air-to-liquid heat exchanger. The at least one cooling unit is associated with the first electronics rack and cools coolant in the coolant loop to, at least in part, facilitate extraction of heat by the air-to-liquid heat exchanger from air passing thereacross. The airflow director is configured to facilitate directing at least a portion of air passing through the second electronics rack to also pass across the air-to-liquid heat exchanger associated with the first electronics rack. The at least one facility coolant loop is coupled to the at least one cooling unit associated with the first electronics rack, and facilitates removal of heat from the coolant in the coolant loop to facilitate extraction of heat by the air-to-liquid heat exchanger from air passing across the air-to-liquid heat exchanger.

In a further aspect, a method is provided which includes: providing a multi-rack assembly, wherein the providing comprises: disposing a first electronics rack and a second electronics rack adjacent to each other, each electronics rack of the first electronics rack and the second electronics rack being at least partially air-cooled and each having an air inlet side and an air outlet side, wherein the first electronics rack and the second electronics rack are disposed adjacent to each other, with at least one of the air inlet sides facing in a first direction, or the air outlet sides facing in a second direction; providing an air-to-liquid heat exchanger associated with the first electronics rack for cooling at least a portion of air passing through the first electronics rack, the air-to-liquid heat exchanger being disposed at one of the air inlet side or the air outlet side of the first electronics rack and being coupled in fluid communication with a coolant loop to receive coolant therefrom and exhaust coolant thereto, the air-to-liquid heat exchanger transferring heat from air passing thereacross to coolant passing therethrough; providing at least one cooling unit associated with the first electronics rack and cooling coolant in the coolant loop to, at least in part, facilitate extraction of heat by the air-to-liquid heat exchanger from air passing thereacross; and providing an airflow director associated with the second electronics rack to facilitate ducting at least a portion of air passing through the second electronics rack to also pass across the air-to-liquid heat exchanger associated with the first electronics rack.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 7A & 7B depict interior and exterior views, respectively, of one embodiment of a rack door having an air-to-liquid heat exchanger disposed therein, in accordance with one or more aspects of the present invention;

DETAILED DESCRIPTION

Figure 1:
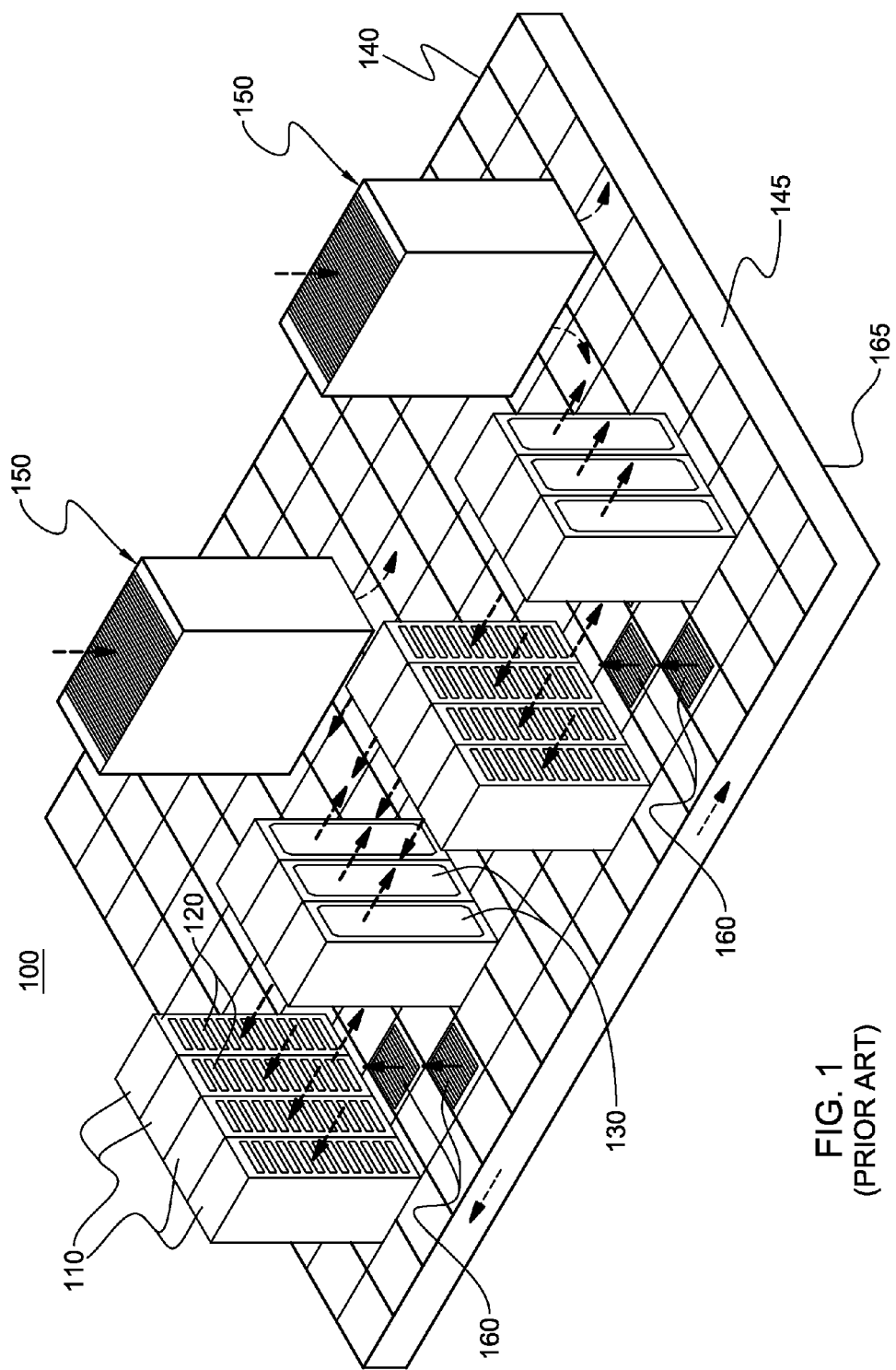
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the liquid-to-liquid heat exchanger can vary without departing from the scope of the invention disclosed herein. Further, as used herein, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

As shown in FIG. 1, in a raised floor layout of an air cooled computer installation or data center 100 typical in the prior art, multiple air-cooled electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between a raised floor 140 and a base or sub-floor 165 of the room. Cooled air is taken in through louvered covers at air inlet sides 120 of the electronics racks and expelled through air outlet sides 130 of the electronics racks. Each air-cooled electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within data center 100. Room air is taken into each air-conditioning unit 150 near an upper portion thereof. This room air comprises in part exhausted air from the "hot" air aisles of the data center defined by opposing air outlet sides 130 of the electronics racks 110.

Figure 2:
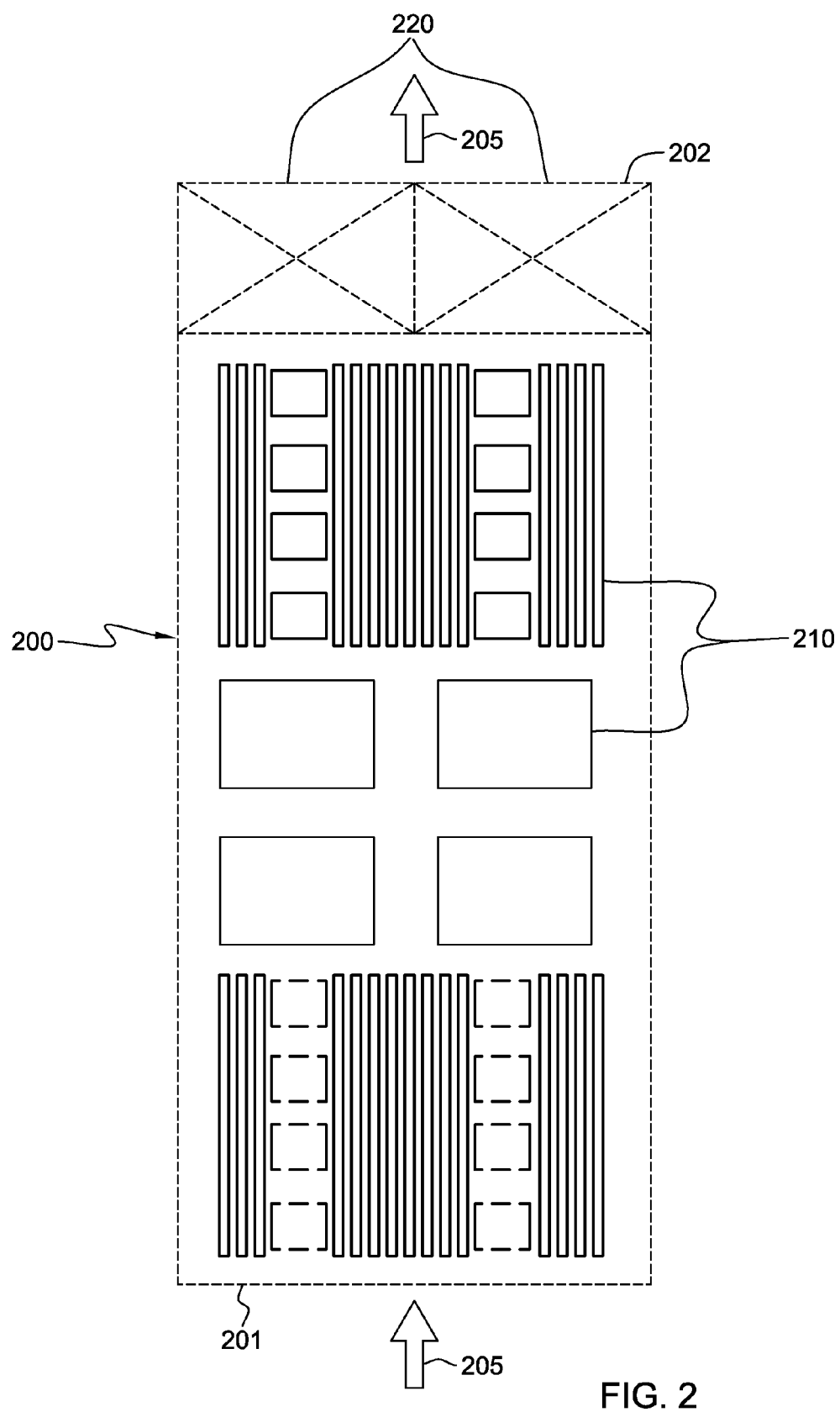
FIG. 2 is a top plan view of one embodiment of an electronic subsystem layout of an air-cooled electronics rack utilizing air-cooling of electronic components of the electronic subsystem, in accordance with one or more aspects of the present invention.

FIG. 2 depicts one embodiment of an electronic subsystem 200 layout for an air-cooled electronics rack, such as air-cooled electronics rack 110 of FIG. 1. The electronic subsystem 200 includes a plurality of heat-generating electronic components 210 which are air-cooled by an airflow 205 ingressing through an air inlet side 201, and egressing via an air outlet side 202 of electronic subsystem 200. One or more air-moving devices 220 facilitate airflow 205 through electronic subsystem 200. In operation, cool air enters via air inlet side 201, becomes heated by the heat-generating electronic components 210 of electronic subsystem 200, and is exhausted out the air outlet side 202 of electronic system 200 as heated exhaust air.

Due to the ever increasing airflow requirements through the electronics racks, and limits of air distribution within the typical computer room installation, recirculation problems within the room may occur. This recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from an air outlet side of a rack unit to an air inlet side. This recirculating flow is often very complex in nature, and can lead to significantly higher rack inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 15-32° C. range. For a raised floor layout such as depicted in FIG. 1, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 3:
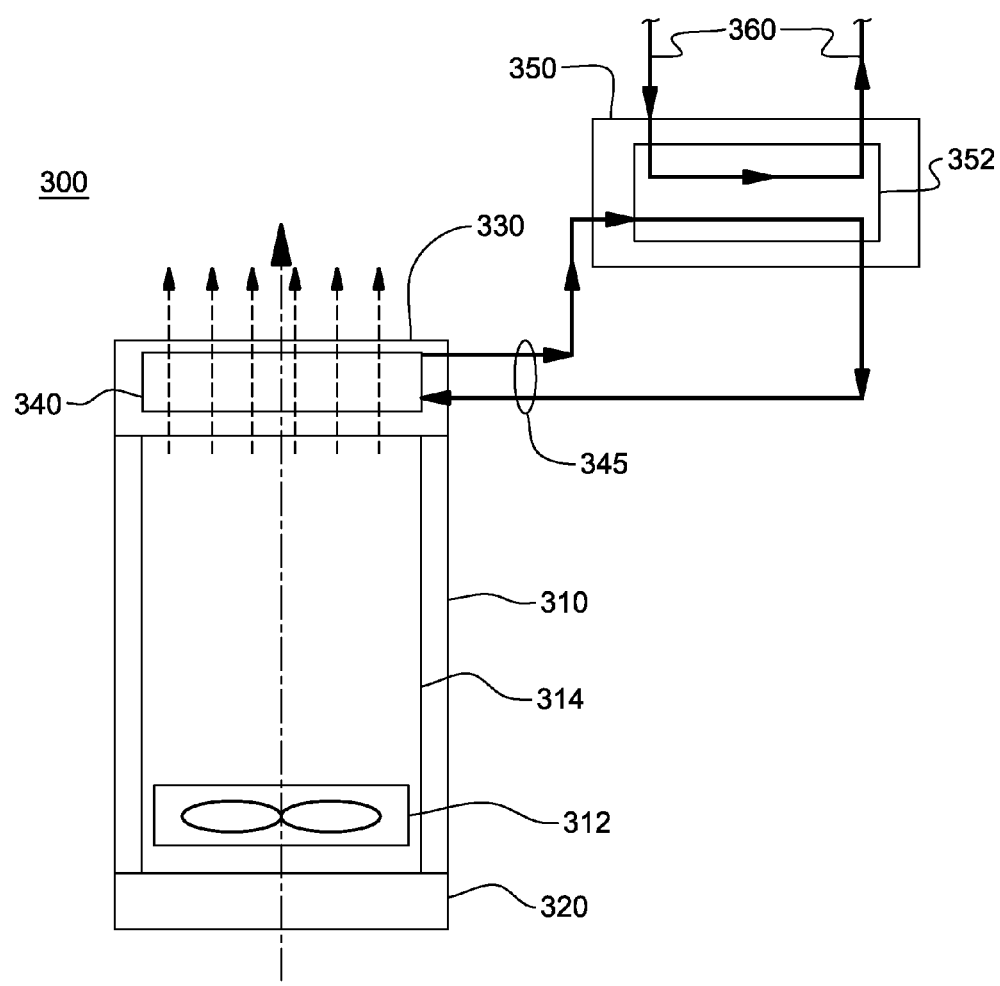
FIG. 3 is a top plan view of one embodiment of an electronics rack with an air-to-liquid heat exchanger mounted to an air outlet side door thereof, and with extracted heat being rejected to facility coolant via a coolant distribution unit, in accordance with one or more aspects of the present invention.

FIG. 3 depicts one embodiment of a cooled electronic system, generally denoted 300. In this embodiment, electronic system 300 includes an electronics rack 310 having an inlet door 320 and an outlet door 330, which have openings to allow for the ingress and egress of external air, respectively, through the air inlet side and air outlet side of electronics rack 310. The system further includes at least one air-moving device 312 for moving external air across at least one electronic system or component 314 positioned within the electronics rack. Disposed within outlet door 330 is an air-to-liquid heat exchanger 340 across which the inlet-to-outlet airflow through the electronics rack passes. A coolant distribution unit 350 is used to buffer the air-to-liquid heat exchanger from facility coolant in a facility coolant loop.

Air-to-liquid heat exchanger 340 removes heat from the exhausted inlet-to-outlet airflow through the electronics rack via circulating system coolant in system coolant loop 345, for rejection in coolant distribution unit 350 to facility coolant in a facility coolant loop 360, that is, via a liquid-to-liquid heat exchanger 352 disposed therein. This cooling apparatus advantageously reduces heat load on existing air-conditioning units within the data center, and facilitates cooling of electronics racks by cooling the air egressing from the electronics rack and thus cooling any air recirculating to the air inlet side thereof.

As shown in FIG. 3, a system coolant loop 345 couples air-to-liquid heat exchanger 340 to coolant distribution unit 350. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

In one implementation, the inlet and outlet plenums of the air-to-liquid heat exchanger mount within the door and are coupled to coolant supply and return manifolds disposed beneath a raised floor. Alternatively, system coolant supply and return manifolds or headers for the air-to-liquid heat exchangers may be mounted over the electronics racks within the data center. In such an embodiment, system coolant enters and exits the respective coolant inlet and outlet plenums at the top of the rack door, using flexible coolant supply and return hoses, which are at least partially looped and are sized to facilitate opening and closing of the rack door (containing the air-to-liquid heat exchanger). Additionally, structures may be provided at the ends of the hoses to relieve stress at the hose ends, which results from opening or closing of the door.

Figure 4:
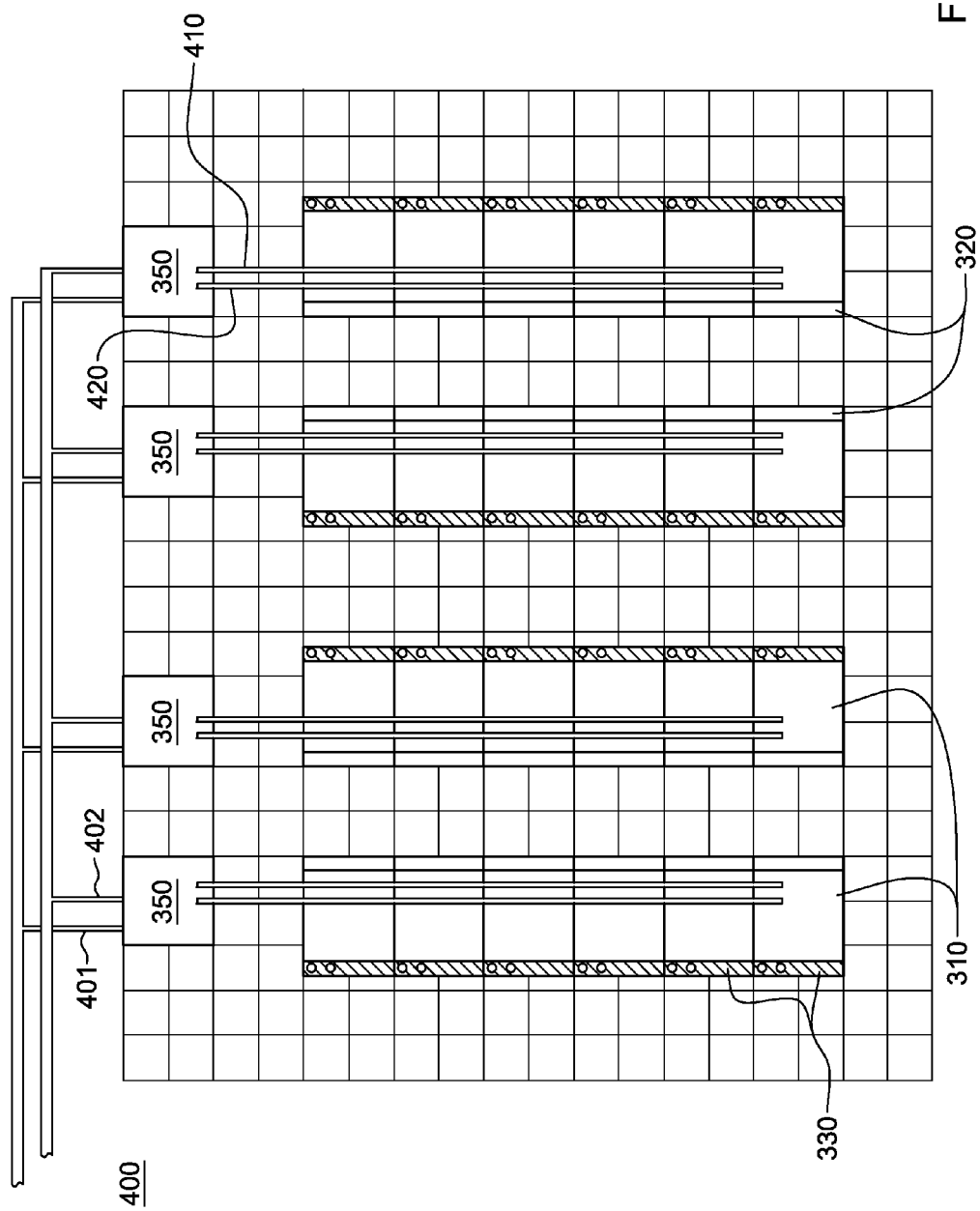
FIG. 4 depicts one embodiment of a data center layout comprising multiple coolant distribution units providing liquid coolant to a plurality of air-to-liquid heat exchangers associated with a plurality of electronics racks disposed in rows in the data center, and which is to be modified to include one or more multi-rack assemblies, in accordance with one or more aspects of the present invention.

FIG. 4 is a plan view of one embodiment of a data center, generally denoted 400, employing cooled electronics systems. Data center 400 includes a plurality of rows of electronics racks 310, each of which includes an inlet door 320 at the air inlet side, and a hinged outlet door 330 at the air outlet side, such as described above in connection with the embodiment of FIG. 3. In this embodiment, each outlet door 330 supports an air-to-liquid heat exchanger and system coolant inlet and outlet plenums. Multiple coolant conditioning units 350, referred to hereinbelow as pumping units, are disposed within the data center (along with possibly one or more air-conditioning units (not shown)). As shown, in one embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 401, and is returned via facility coolant return line 402. System coolant, such as water, is provided via a system coolant supply header 410 extending over the respective row of electronics racks, and is returned via a system coolant return header 420 also extending over the respective row of electronics racks. In one embodiment, the system coolant supply and return headers 410, 420 are hard-plumbed within the data center, and preconfigured to align over and include branch lines extending towards electronics racks in a respective row of electronics racks.

Figure 5:
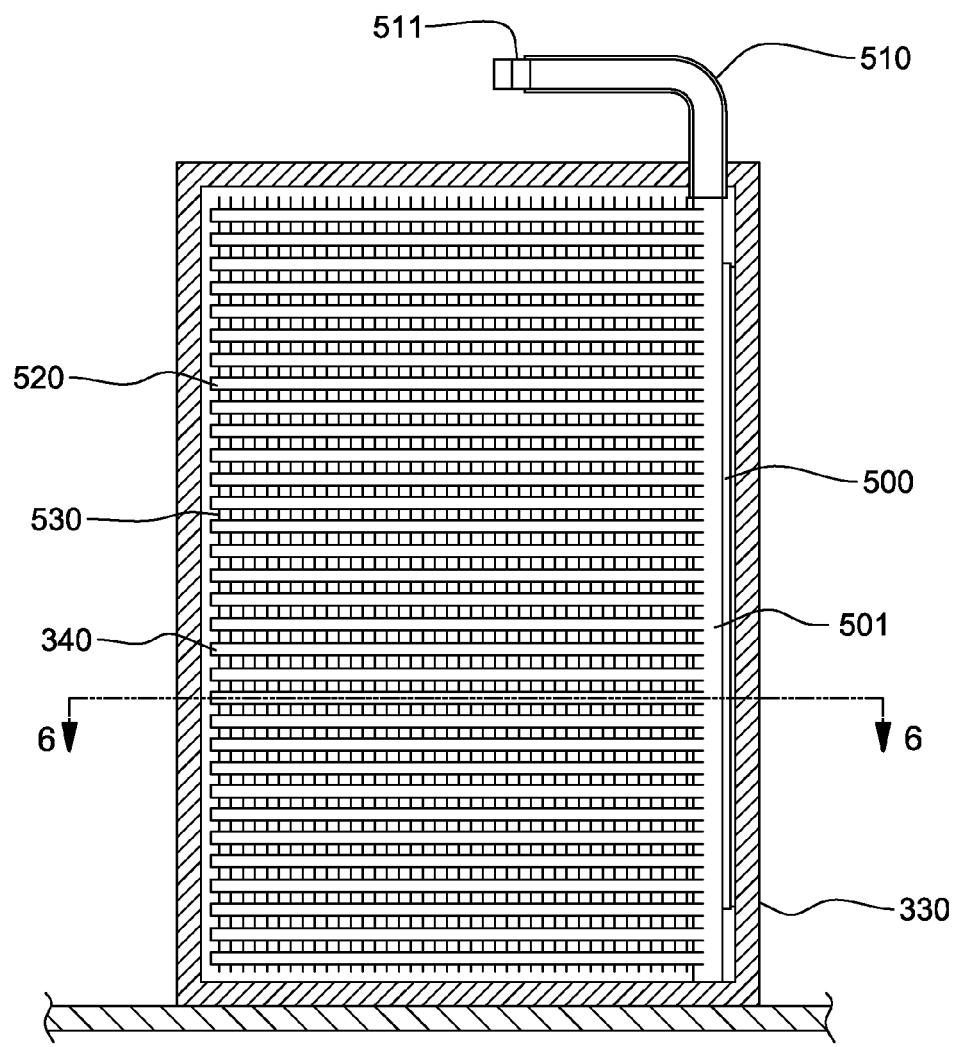
FIG. 5 is a partial cross-sectional elevational view of one embodiment of a rack door with an air-to-liquid heat exchanger mounted thereto, taken along line 5-5 in FIG. 6, in accordance with one or more aspects of the present invention.
Figure 6:
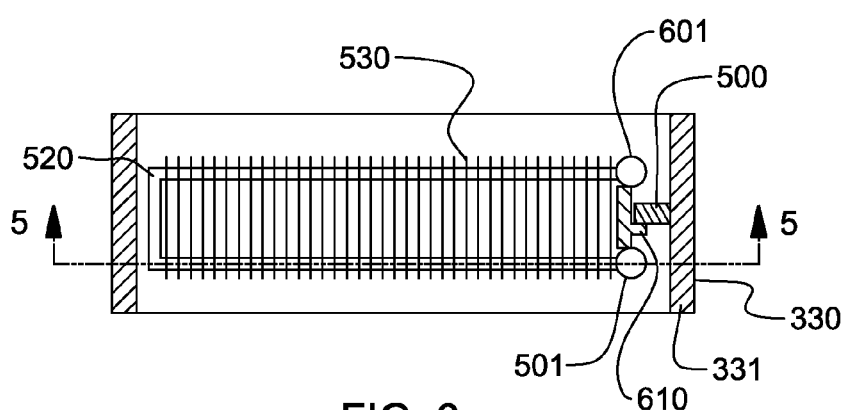
FIG. 6 is a cross-sectional plan view of the rack door and air-to-liquid heat exchanger of FIG. 5, taken along line 6-6 in FIG. 5, in accordance with one or more aspects of the present invention.

FIGS. 5 & 6 depict one embodiment of outlet door 330 supporting air-to-liquid heat exchanger 340, and system coolant inlet and outlet plenums 501, 601. Referring to both figures collectively, outlet door frame 331 supports a rigid flap 500, which attaches, for example, by brazing or soldering, to a plate 610 secured between the system coolant inlet plenum 501 and system coolant outlet plenum 601.

In FIG. 5, right angle bend 510 is shown disposed at the top of system coolant inlet plenum 501. This right angle bend defines a horizontal inlet plenum portion, which extends above the top of door 330. The coolant inlet to system coolant inlet plenum 501 is coupled to a connect coupling 511 for facilitating connection thereof to the respective supply hose, as described above. In this embodiment, the air-to-liquid heat exchanger comprises a plurality of horizontally-oriented heat exchange tube sections 520. These heat exchange tube sections 520 each comprise a coolant channel having an inlet and an outlet, with each coolant channel being coupled to the system coolant inlet plenum 501 and each coolant channel outlet being coupled to the system coolant outlet plenum 601. A plurality of fins 530 are attached to horizontally-oriented heat exchange tube sections 520 for facilitating transfer of heat from air passing across the air-to-liquid heat exchanger to coolant flowing through the plurality of heat exchange tube sections 520. In one embodiment, the plurality of fins are vertically-oriented, rectangular fins attached to horizontally-oriented heat exchange tube sections 520.

By way of specific example, FIGS. 7A & 7B depict one embodiment of an electronics rack door 700 with a cooling apparatus mounted thereto, which as explained below, may be configured and sized for a multi-rack assembly, in accordance with one or more aspects of the present invention. This cooling apparatus includes an air-to-liquid heat exchanger 715 across which exhausting air from the air outlet side of the electronics rack(s) (not shown) flows. As illustrated, air-to-liquid heat exchanger 715 is disposed within an airflow opening in a door frame 710 which vertically mounts along a first edge 711 to the electronics rack(s). The cooling apparatus includes a system coolant inlet plenum 720 and system coolant outlet plenum 725 which (in one embodiment) extend vertically into and along a second edge 712 of heat exchanger door 700. As illustrated, second edge 712 of heat exchanger door 700 is in opposing relation to first edge 711, which hingedly mounts to an electronics rack. Thus, in this embodiment, the system coolant inlet and outlet plenums 720, 725 are disposed remote from the edge of the heat exchanger door mounted to the electronics rack(s). This will advantageously reduce stress (in an overhead supply and return implementation) on the system coolant supply and return hoses, during opening or closing of the door, particularly when the first ends of the supply and return hoses are affixed in parallel relation on top of the rack door to extend towards the first edge of the rack door. As illustrated, system coolant inlet plenum 720 includes a coolant inlet 721 which has a connect coupling 722 for facilitating fluid tight connection to the system coolant supply hose (not shown). Similarly, system coolant outlet plenum 725 includes a coolant outlet 726 with a connect coupling 727 to facilitate fluid tight connection to a system coolant return hose. In one embodiment, these connect couplings are quick connect couplings such as the commercially available quick connect couplings offered by Colder Products Company, of St. Paul, Minn., U.S.A., or Parker Hannifin, of Cleveland, Ohio, U.S.A.

FIGS. 7A & 7B also illustrate one embodiment of a stress relief structure 730 attached to an upper surface 713 of door 700. Stress relief structure 730 includes a first opening 731 and a second opening 732 which are respectively configured to receive the system coolant supply hose and the system coolant return hose.

Figure 8:
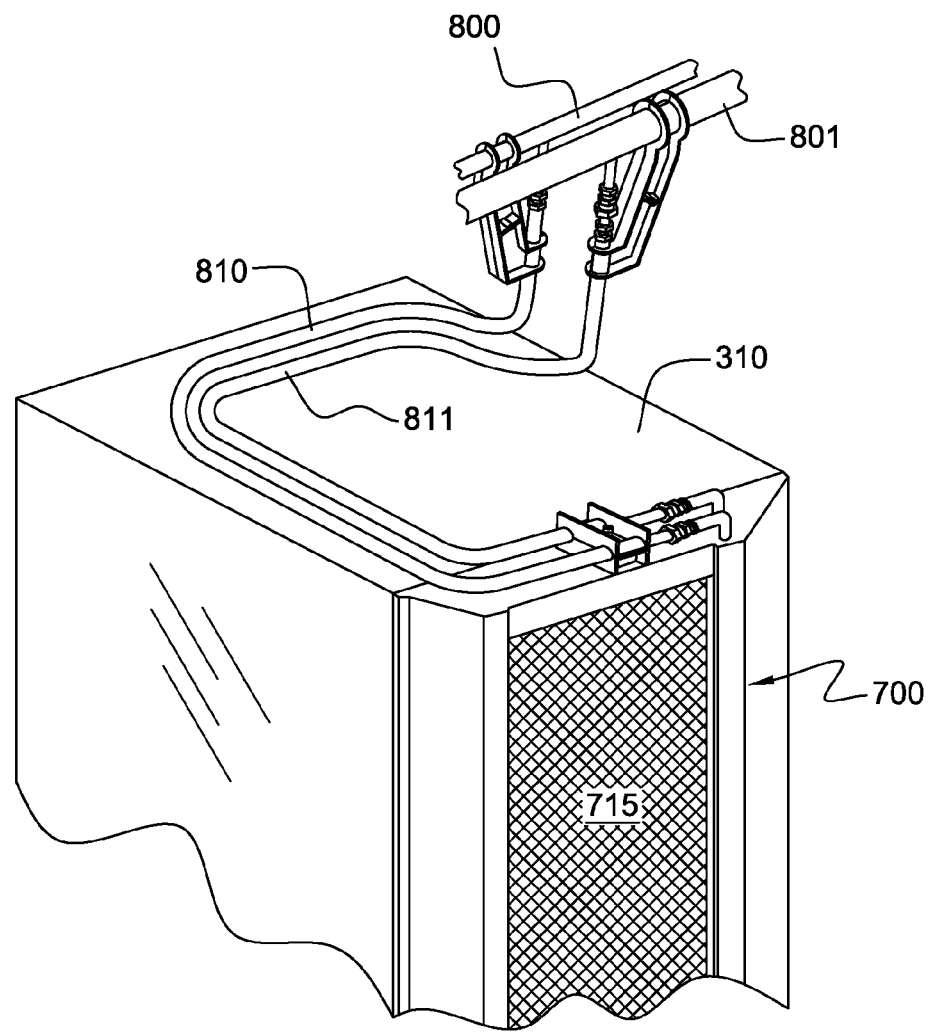
FIG. 8 is a partial isometric view of one embodiment of a single electronics rack, with a rack door and an air-to-liquid heat exchanger, and illustrating one embodiment of coolant supply and return headers of a data center, in accordance with one or more aspects of the present invention.

FIG. 8 depicts one embodiment of electronics rack 310 comprising a hinged outlet door 700 with an air-to-liquid heat exchanger 715 disposed therein, and illustrating overhead system coolant supply and return headers 800, 801, respectively. As shown, system coolant supply and return hoses 810, 811 couple the air-to-liquid heat exchanger 715 in fluid communication with the system coolant supply and return headers 800, 801, respectively. In one embodiment, system coolant supply and return hoses 810, 811 are sufficiently sized to allow for translational and rotational movement of the hoses with opening or closing of the heat exchanger door 700. If desired, retention loops could be provided for constraining movement of the hoses at multiple locations on top of the electronics rack.

Those skilled in the art will note that the door, door frame and air-to-liquid heat exchanger embodiments depicted in FIGS. 3-8 are presented by way of example only. For example, a multi-rack assembly with door-mounted heat exchanger, such as described hereinbelow, may be implemented with similar cooling structures such as those described above in connection with FIGS. 3-8, or in various alternate embodiments thereof. For instance, in one alternate embodiment, the system coolant supply and return manifolds could be disposed beneath the electronics racks in a raised floor data center. Further, the particular design of the air-to-liquid heat exchanger can vary without departing from the one or more aspects of the present invention disclosed herein.

Figure 9A:
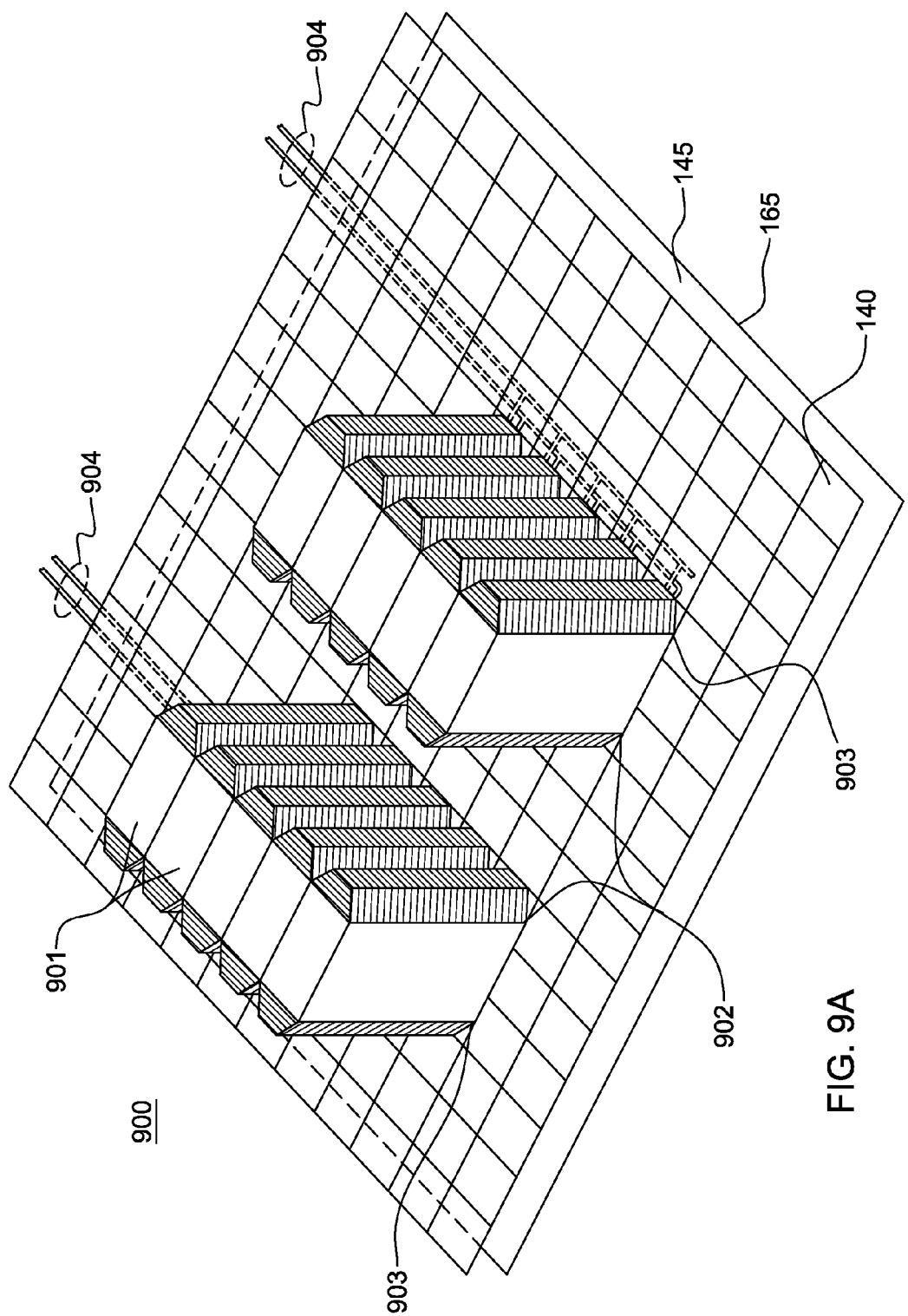
FIG. 9A depicts an alternate embodiment of a data center employing a plurality of liquid-cooled electronics racks, in accordance with one or more aspects of the present invention.

FIG. 9A depicts an alternate embodiment of a data center, generally denoted 900, comprising multiple liquid-cooled electronics racks 901 arranged in one or more rows within the data center. As with the data center embodiment of FIG. 1, the liquid-cooled electronics racks within the data center 900 of FIG. 9A may house several hundred, or even several thousand microprocessors. The electronics racks are disposed, in this embodiment, on raised floor 140, which is spaced above base or sub-floor 165 of the room, and which (in this embodiment) accommodates one or more facility coolant loops 904 providing chilled facility coolant to cooling units disposed within the liquid-cooled electronics racks 901, as explained further below with reference to FIGS. 9B-14. As also explained below, in one embodiment, liquid-cooled electronics racks 901 comprise an air inlet side 902 and an air outlet side 903, which may comprise louvered doors that allow for the ingress and egress, respectively, of external air through the electronics rack.

Figure 9B:
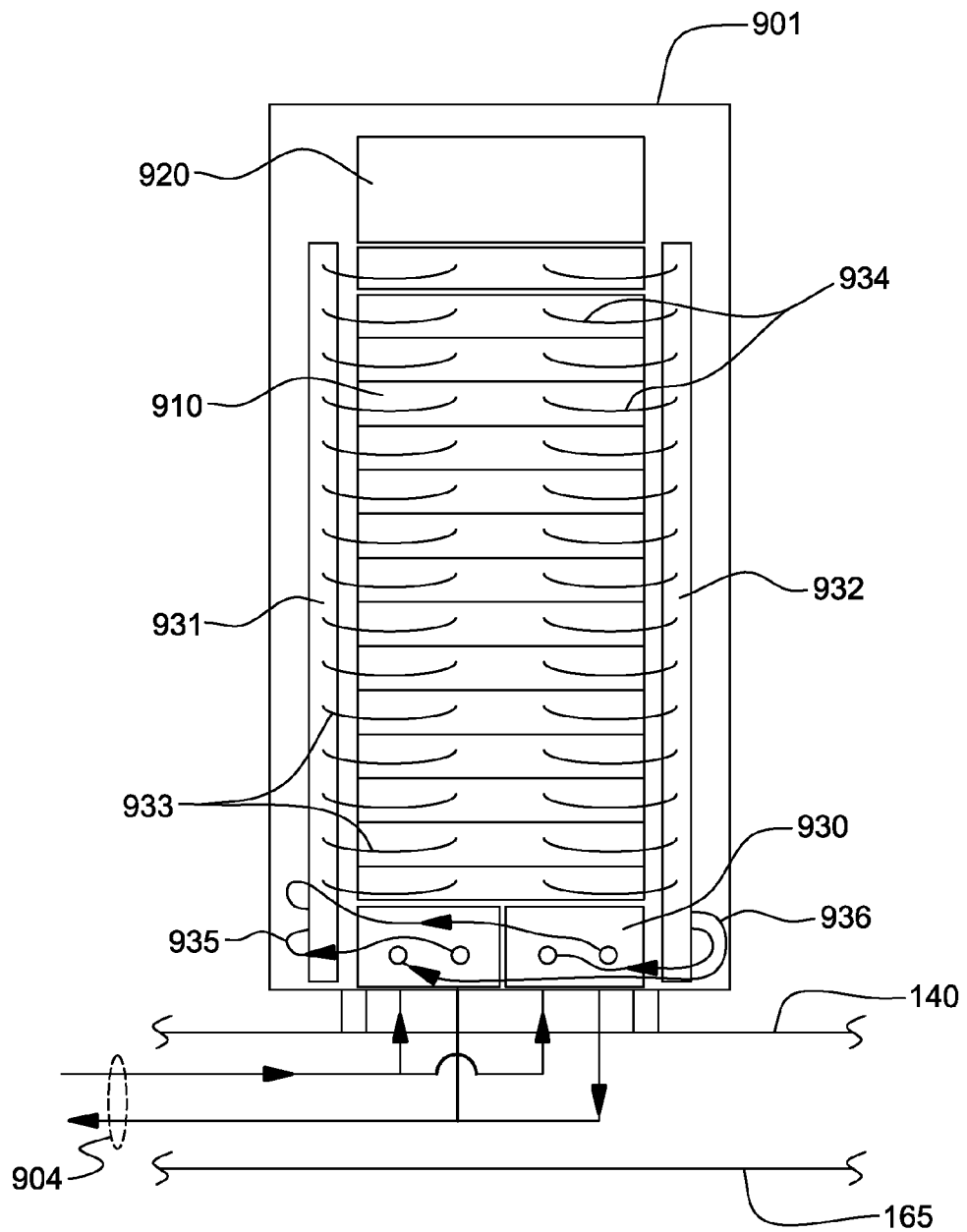
FIG. 9B is a front elevational view of one embodiment of a liquid-cooled electronics rack comprising multiple electronic subsystems cooled by a cooling apparatus, in accordance with one or more aspects of the present invention.

FIG. 9B depicts one embodiment of a liquid-cooled electronics rack 901 which employs a cooling apparatus to be monitored and operated as described herein. In one embodiment, liquid-cooled electronics rack 901 comprises a plurality of electronic subsystems 910, which comprise (in one embodiment) processor or server nodes. A bulk power regulator 920 is shown disposed at an upper portion of liquid-cooled electronics rack 901, and two modular cooling units (MCUs) 930 are disposed in a lower portion of the liquid-cooled electronics rack. In the embodiments described herein, the coolant is assumed to be water or an aqueous-based solution, again, by way of example only.

In addition to MCUs 930, the cooling apparatus includes a system water supply manifold 931, a system water return manifold 932, and manifold-to-node fluid connect hoses 933 coupling system water supply manifold 931 to electronic subsystems 910, and node-to-manifold fluid connect hoses 934 coupling the individual electronic subsystems 910 to system water return manifold 932. Each MCU 930 is in fluid communication with system water supply manifold 931 via a respective system water supply hose 935, and each MCU 930 is in fluid communication with system water return manifold 932 via a respective system water return hose 936.

As illustrated, heat load of the electronic subsystems is transferred from the system water to cooler facility water supplied by facility water supply line 940 and facility water return line 941 disposed, in the illustrated embodiment, in the space between a raised floor 140 and a base floor 165.

Figure 10:
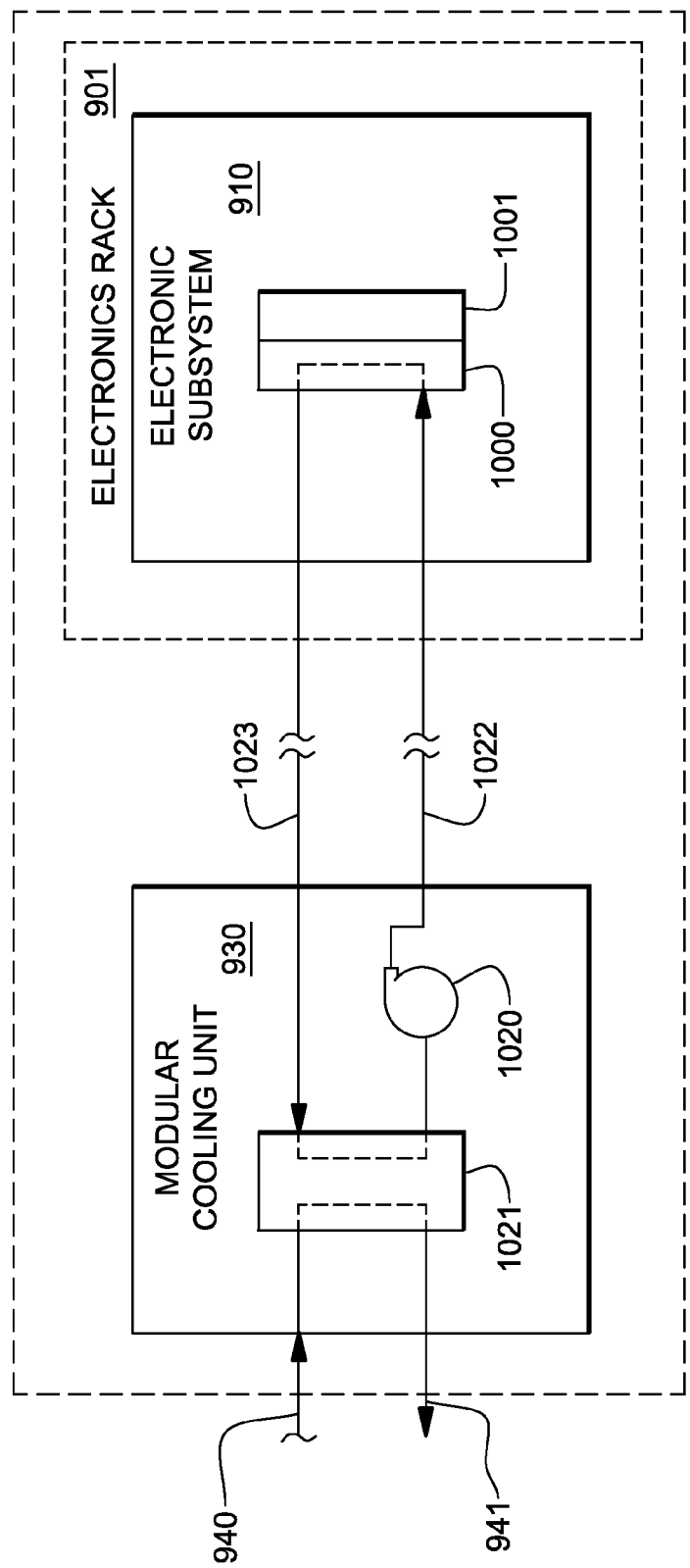
FIG. 10 is a schematic of one embodiment of an electronic subsystem of a liquid-cooled electronics rack, wherein an electronic module is liquid-cooled by system coolant provided by one or more modular cooling units disposed within the electronics rack, in accordance with one or more aspects of the present invention.

FIG. 10 schematically illustrates operation of the cooling apparatus of FIG. 9B, wherein a liquid-cooled cold plate 1000 is shown coupled to an electronic module 1001 of an electronic subsystem 910 within the liquid-cooled electronics rack 901. Heat is removed from electronic module 1001 via the system coolant circulated via pump 1020 through cold plate 1000 within the system coolant loop defined by liquid-to-liquid heat exchanger 1021 of modular cooling unit 930, lines 1022, 1023 and cold plate 1000. The system coolant loop and modular cooling unit 930 are designed to provide coolant of a controlled temperature and pressure, as well as controlled chemistry and cleanliness to cool the electronic module(s). Furthermore, the system coolant is physically separate from the less controlled facility coolant in lines 940, 941, to which heat is ultimately transferred.

Figure 11:
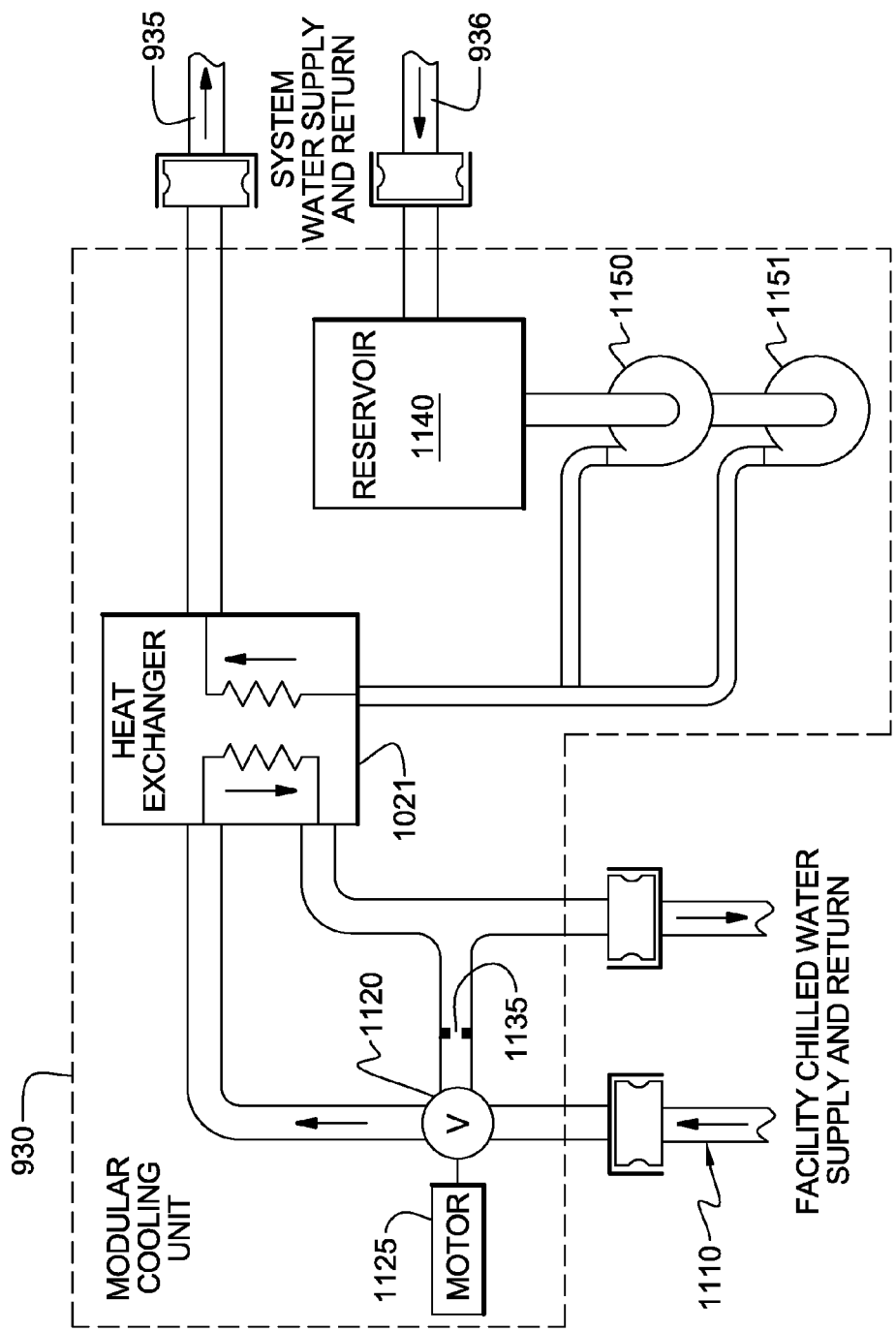
FIG. 11 is a schematic of one embodiment of a modular cooling unit for a liquid-cooled electronics rack, in accordance with one or more aspects of the present invention.

FIG. 11 depicts a more detailed embodiment of a modular cooling unit 930, in accordance with an aspect of the present invention. As shown in FIG. 11, modular cooling unit 930 includes a first cooling loop wherein building chilled, facility coolant is supplied 1110 and passes through a control valve 1120 driven by a motor 1125. Valve 1120 determines an amount of facility coolant to be passed through heat exchanger 1021, with a portion of the facility coolant possibly being returned directly via a bypass orifice 1135. The modular water cooling unit further includes a second cooling loop with a reservoir tank 1140 from which system coolant is pumped, either by pump 1150 or pump 1151, into the heat exchanger 1021 for conditioning and output thereof, as cooled system coolant to the electronics rack to be cooled. The cooled system coolant is supplied to the system water supply manifold and system water return manifold of the liquid-cooled electronics rack via the system water supply hose 935 and system water return hose 936, respectively.

Figure 12:
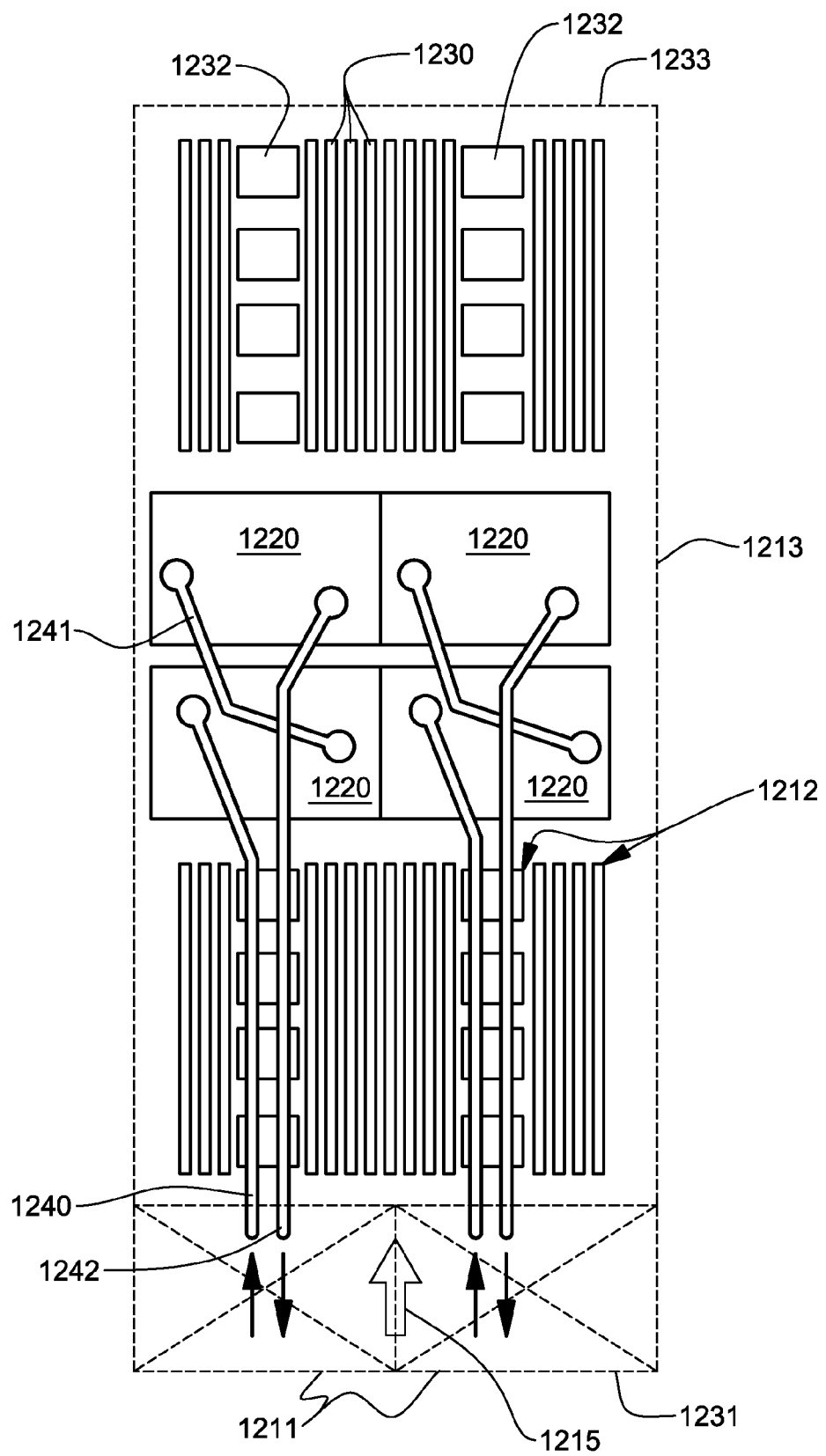
FIG. 12 is a plan view of one embodiment of an electronic subsystem layout illustrating an air and liquid-cooling subsystem for cooling components of an electronic subsystem of a liquid-cooled electronics rack, in accordance with one or more aspects of the present invention.

FIG. 12 depicts one embodiment of an electronic subsystem 1213 component layout wherein one or more air moving devices 1211 provide forced air flow 1215 to cool multiple components 1212 within electronic subsystem 1213. Cool air is taken in through a front 1231 and exhausted out a back 1233 of the drawer. The multiple components to be cooled include multiple processor modules to which liquid-cooled cold plates 1220 (of a liquid-based cooling system) are coupled, as well as multiple arrays of memory modules 1230 (e.g., dual in-line memory modules (DIMMs)) and multiple rows of memory support modules 1232 (e.g., DIMM control modules) to which air-cooled heat sinks are coupled. In the embodiment illustrated, memory modules 1230 and the memory support modules 1232 are partially arrayed near front 1231 of electronic subsystem 910, and partially arrayed near back 1233 of electronic subsystem 910. Also, in the embodiment of FIG. 12, memory modules 1230 and the memory support modules 1232 are cooled by air flow 1215 across the electronic subsystem.

The illustrated liquid-based cooling system further includes multiple coolant-carrying tubes connected to and in fluid communication with liquid-cooled cold plates 1220. The coolant-carrying tubes comprise sets of coolant-carrying tubes, with each set including (for example) a coolant supply tube 1240, a bridge tube 1241 and a coolant return tube 1242. In this example, each set of tubes provides liquid coolant to a series-connected pair of cold plates 1220 (coupled to a pair of processor modules). Coolant flows into a first cold plate of each pair via the coolant supply tube 1240 and from the first cold plate to a second cold plate of the pair via bridge tube or line 1241, which may or may not be thermally conductive.

From the second cold plate of the pair, coolant is returned through the respective coolant return tube 1242.

Figure 13:
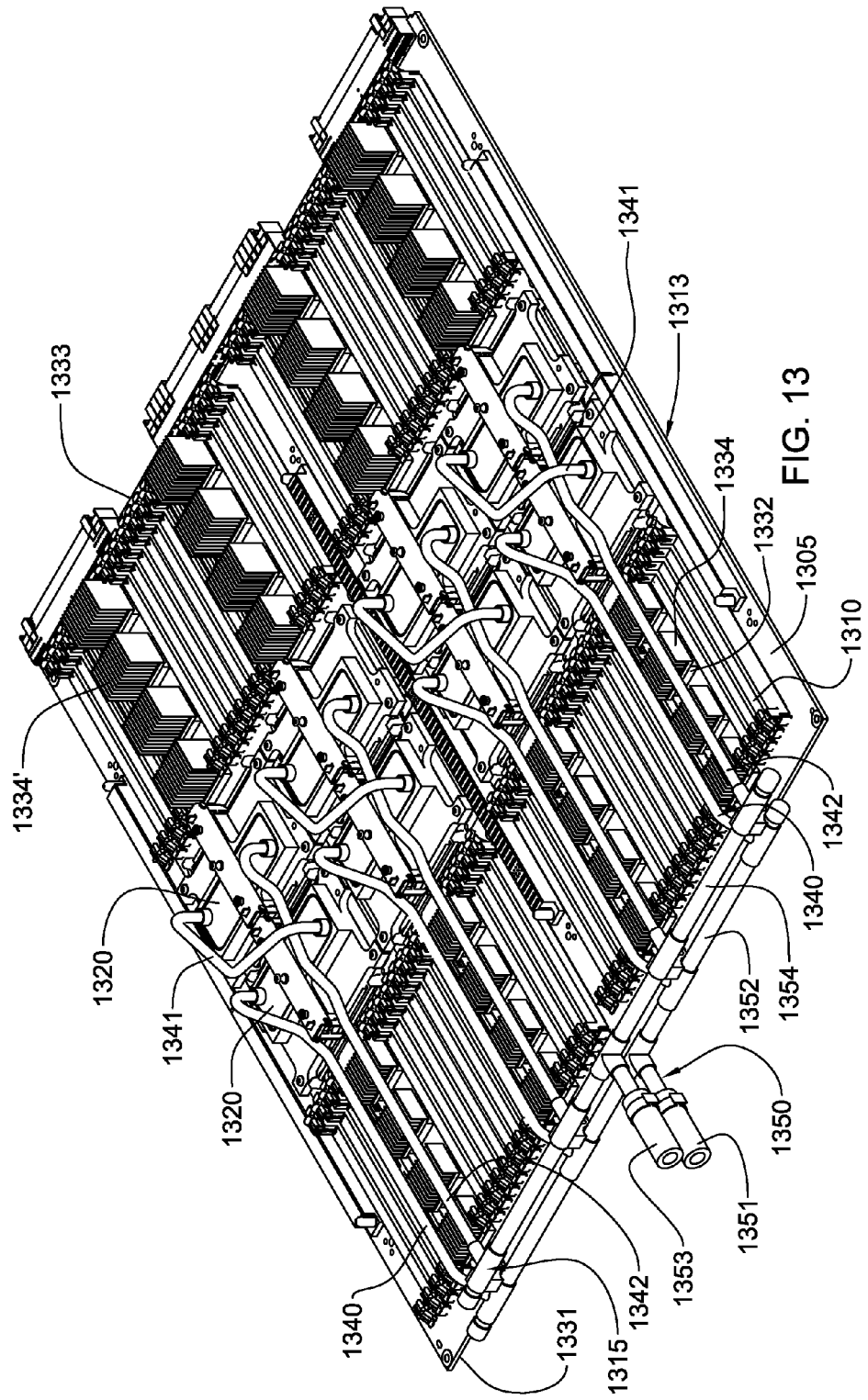
FIG. 13 depicts one detailed embodiment of a partially assembled electronic subsystem layout, wherein the electronic subsystem includes eight high-heat-generating electronic components to be cooled, each having a respective liquid-cooled structure of a liquid-based cooling system coupled thereto, in accordance with one or more aspects of the present invention.

FIG. 13 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronic system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet a given customer's specifications and need for reliability.

Thus, presented herein in one aspect (and by way of example only) is a robust and reliable liquid-based cooling system specially preconfigured and prefabricated as a monolithic structure for positioning within a particular electronics drawer.

FIG. 13 is an isometric view of one embodiment of an electronic drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 13 depicts a partially assembled electronic system 1313 and an assembled liquid-based cooling system 1315 coupled to primary heat generating components (e.g., including processor dies) to be cooled. In this embodiment, the electronic system is configured for (or as) an electronic drawer or subsystem of an electronics rack, and includes, by way of example, a support substrate or planar board 1305, a plurality of memory module sockets 1310 (with the memory modules (e.g., dual in-line memory modules) not shown), multiple rows of memory support modules 1332 (each having coupled thereto an air-cooled heat sink 1334), and multiple processor modules (not shown) disposed below the liquid-cooled cold plates 1320 of the liquid-based cooling system 1315.

In addition to liquid-cooled cold plates 1320, liquid-based cooling system 1315 includes multiple coolant-carrying tubes, including coolant supply tubes 1340 and coolant return tubes 1342 in fluid communication with respective liquid-cooled cold plates 1320. The coolant-carrying tubes 1340, 1342 are also connected to a header (or manifold) subassembly 1350 which facilitates distribution of liquid coolant to the coolant supply tubes and return of liquid coolant from the coolant return tubes 1342. In this embodiment, the air-cooled heat sinks 1334 coupled to memory support modules 1332 closer to front 1331 of electronic drawer 1313 are shorter in height than the air-cooled heat sinks 1334' coupled to memory support modules 1332 near back 1333 of electronics drawer 1313. This size difference is to accommodate the coolant-carrying tubes 1340, 1342 since, in this embodiment, the header subassembly 1350 is at the front 1331 of the electronic drawer and the multiple liquid-cooled cold plates 1320 are in the middle of the drawer.

Liquid-based cooling system 1315 comprises (in this embodiment) a preconfigured monolithic structure which includes multiple (pre-assembled) liquid-cooled cold plates 1320 configured and disposed in spaced relation to engage respective heat generating electronic components. Each liquid-cooled cold plate 1320 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 1320 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 13, header subassembly 1350 includes two liquid manifolds, i.e., a coolant supply header 1352 and a coolant return header 1354, which in one embodiment, are coupled together via supporting brackets. In the monolithic cooling structure of FIG. 13, the coolant supply header 1352 is metallurgically bonded and in fluid communication to each coolant supply tube 1340, while the coolant return header 1354 is metallurgically bonded and in fluid communication to each coolant return tube 1342. A single coolant inlet 1351 and a single coolant outlet 1353 extend from the header subassembly for coupling to the electronics rack's coolant supply and return manifolds (not shown).

FIG. 13 also depicts one embodiment of the preconfigured, coolant-carrying tubes. In addition to coolant supply tubes 1340 and coolant return tubes 1342, bridge tubes or lines 1341 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 1340, bridge tubes 1341 and coolant return tubes 1342 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronic system to facilitate installation of the monolithic structure in engaging relation with the electronic system.

Liquid cooling of heat-generating electronic components within an electronics rack can greatly facilitate removal of heat generated by those components. However, in certain high performance systems, the heat dissipated by certain components being liquid-cooled, such as processors, may exceed the ability of the liquid cooling system to extract heat. For example, a fully configured liquid-cooled electronics rack, such as described herein may dissipate approximately 72 kW of heat. Half of this heat may be removed by liquid coolant using liquid-cooled cold plates such as described above. The other half of the heat may be dissipated by memory, power supplies, etc., which are air-cooled. Given the density at which electronics racks are placed on a data center floor, existing air-conditioning facilities are stressed with such a high air heat load from the electronics rack. Thus, a solution presented herein is to incorporate an air-to-liquid heat exchanger, for example, at the air outlet side of the electronics rack, to extract heat from air egressing from the electronics rack. This solution is presented in combination with liquid-cooled cold plate cooling of certain primary heat-generating components within the electronics rack. To provide the necessary amount of coolant, two MCUs are (in one embodiment) associated with the electronics rack, and system coolant is fed from each MCU to the air-to-liquid heat exchanger in parallel to the flow of system coolant to the liquid-cooled cold plates disposed within the one or more electronic subsystems of the electronics rack.

Also, for a high availability system, techniques may be provided for maintaining operation of one modular cooling unit, notwithstanding failure of another modular cooling unit of an electronics rack. This allows continued provision of system coolant to the one or more electronic subsystems of the rack being liquid-cooled. To facilitate liquid cooling of the primary heat-generating electronics components within the electronics rack, one or more isolation valves may be employed, in one embodiment upon detection of failure at one MCU of the two MCUs, to shut off coolant flow to the air-to-liquid heat exchanger, and thereby, conserve coolant for the direct cooling of the electronic subsystems.

Figure 14:
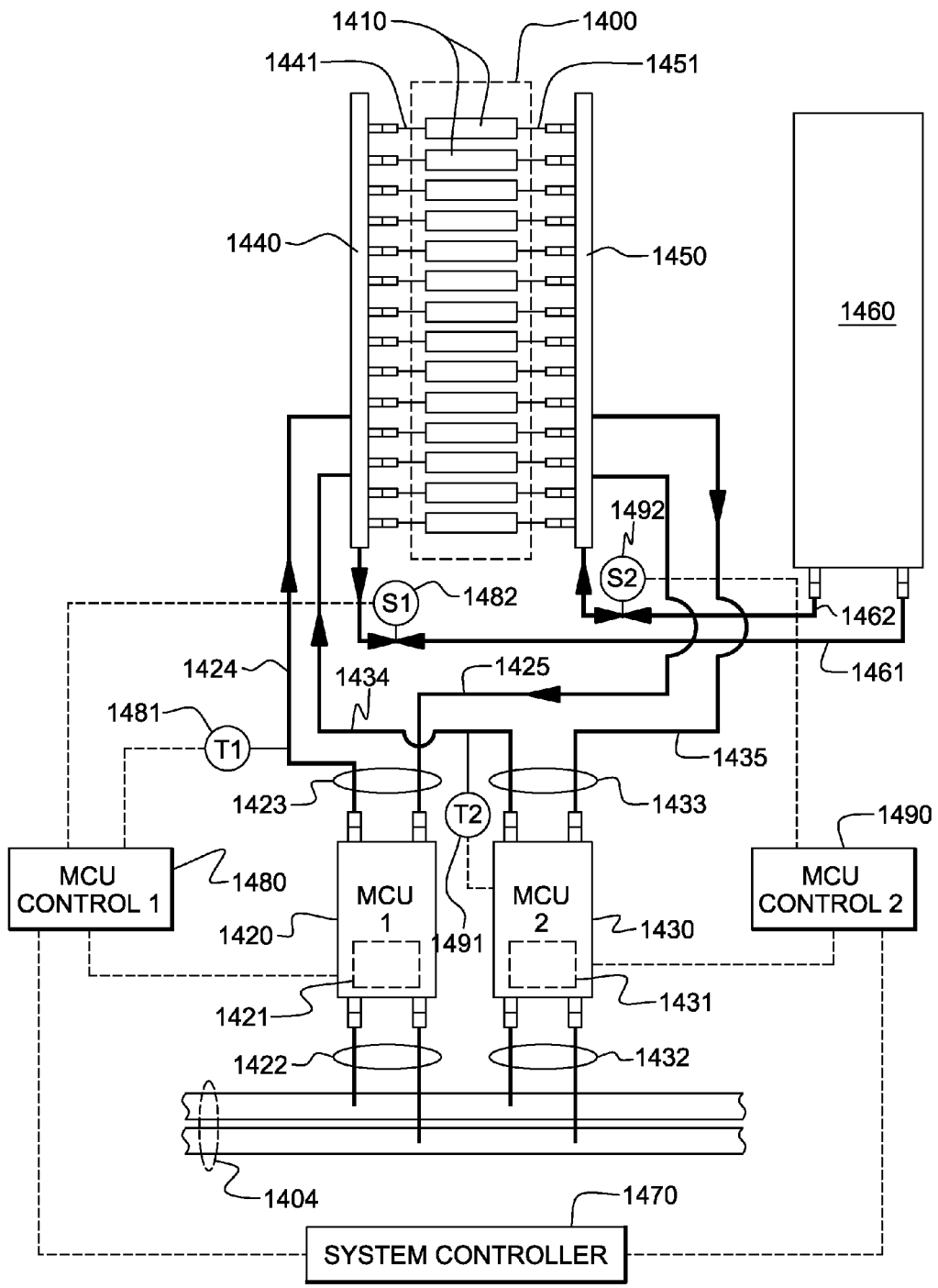
FIG. 14 is a schematic of one embodiment of a cooled electronic system comprising a liquid-cooled electronics rack and a cooling apparatus associated therewith, wherein the cooling apparatus includes two modular cooling units (MCUs) for providing system coolant to the electronic subsystems of the electronics rack, and to an air-to-liquid heat exchanger disposed (for example) at an air outlet side of the electronics rack, for cooling air egressing therefrom, in accordance with one or more aspects of the present invention.

FIG. 14 illustrates one embodiment of a liquid-cooled electronics rack 1400, which includes a plurality of heat-generating electronic subsystems 1410, which are liquid-cooled employing a cooling apparatus comprising at least two modular cooling units (MCUs) 1420, 1430 labeled MCU 1 & MCU 2, respectively. The MCUs are configured and coupled to provide system coolant in parallel to the plurality of heat-generating electronic subsystems for facilitating liquid cooling thereof. Each MCU 1420, 1430 includes a liquid-to-liquid heat exchanger 1421, 1431, coupled to a first coolant loop 1422, 1432, and to a second coolant loop, 1423, 1433, respectively. The first coolant loops 1422, 1432 are coupled to receive chilled coolant, such as facility coolant, via (for example) facility coolant supply line and facility coolant return line of facility coolant loop 1404. Each first coolant loop 1422, 1432 passes at least a portion of the chilled coolant flowing therein through the respective liquid-to-liquid heat exchanger 1421, 1431. Each second coolant loop 1423, 1433 provides cooled system coolant to the plurality of heat-generating electronic subsystems 1410 of electronics rack 1400, and expels heat via the respective liquid-to-liquid heat exchanger 1421, 1431 from the plurality of heat-generating electronic subsystems 1410 to the chilled coolant in the first coolant loop 1422, 1432.

The second coolant loops 1423, 1433 include respective coolant supply lines 1424, 1434, which supply cooled system coolant from the liquid-to-liquid heat exchangers 1421, 1431 to a system coolant supply manifold 1440. System coolant supply manifold 1440 is coupled via flexible supply hoses 1441 to the plurality of heat-generating electronic subsystems 1410 of electronics rack 1400 (e.g., using quick connect couplings connected to respective ports of the system coolant supply manifold). Similarly, second coolant loops 1423, 1433 include system coolant return lines 1425, 1435 coupling a system coolant return manifold 1450 to the respective liquid-to-liquid heat exchangers 1421, 1431. System coolant is exhausted from the plurality of heat-generating electronic subsystems 1410 via flexible return hoses 1451 coupling the heat-generating electronic subsystems to system coolant return manifold 1450. In one embodiment, the return hoses may couple to respective ports of the system coolant return manifold via quick connect couplings. Further, in one embodiment, the plurality of heat-generating electronic subsystems each include a respective liquid-based cooling subsystem, such as described above in connection with FIGS. 9B-13, coupled to flexible supply hoses 1441 and flexible return hoses 1451 to facilitate liquid cooling of one or more heat-generating electronic components disposed within the electronic subsystem.

In addition to supplying and exhausting system coolant in parallel to the plurality of heat-generating electronic subsystems of the electronics rack, the MCUs 1420, 1430 also provide in parallel system coolant to an air-to-liquid heat exchanger 1460 disposed, for example, for cooling air passing through the electronics rack from an air inlet side to an air outlet side thereof. By way of example, air-to-liquid heat exchanger 1460 is a rear door heat exchanger disposed at the air outlet side of electronics rack 1400. Further, in one example, air-to-liquid heat exchanger 1460 is sized to cool substantially all air egressing from electronics rack 1400, and thereby reduce air-conditioning requirements for a data center containing the electronics rack. In one example, a plurality of electronics racks in the data center of FIG. 9A may each be provided with a cooling apparatus such as described herein and depicted in FIG. 14.

In the embodiment of FIG. 14, system coolant flows to and from air-to-liquid heat exchanger 1460 via a coolant supply line 1461 coupling system coolant supply manifold 1440 to air-to-liquid heat exchanger 1460, and a coolant return line 1462 coupling the air-to-liquid heat exchanger to system coolant return manifold 1450. Quick connect couplings may be employed at the inlet and outlet of air-to-liquid heat exchanger 1460 and/or at corresponding ports at the system coolant supply and return manifolds to facilitate connection of coolant supply and return lines 1461, 1462. In one embodiment, it is assumed that one MCU of the two MCUs illustrated is incapable of being sized to function within required design parameters as a primary MCU (with the other MCU being a backup MCU) to extract the full heat load from both the plurality of heat-generating electronic subsystems and the air-to-liquid heat exchanger. Therefore, the two MCUs 1420, 1430 are assumed in normal operation to be functioning in parallel. This also ensures a measure of redundancy to the cooling system.

As shown, the cooling system further includes a system controller 1470, and an MCU control 1 1480 and an MCU control 2 1490, which cooperate together to monitor system coolant temperature of each MCU, and automatically isolate air-to-liquid heat exchanger 1460 upon detection of failure of one MCU (as well as to ensure shut down of a failing MCU) so as not to degrade cooling capability of the system coolant provided by the remaining operational MCU to the electronics subsystems of the rack. In one embodiment, the MCU control 1 and the MCU control 2 are control cards, each associated with a respective MCU.

As shown, system controller 1470 is coupled to both MCU control 1 and the MCU control 2. MCU control 1 1480 is coupled to a temperature sensor T1 1481, which is disposed to sense system coolant temperature within system coolant supply line 1424, for example, near a coolant outlet of liquid-to-liquid heat exchanger 1421 within MCU 1 1420. Additionally, MCU control 1 1480 is coupled to a solenoid-actuated isolation valve Si 1482, which in the embodiment depicted, is disposed within coolant supply line 1461 coupling in fluid communication system coolant supply manifold 1440 to air-to-liquid heat exchanger 1460. Similarly, MCU control 2 1490 couples to MCU 2 1430, as well as to a second temperature sensor T2 1491, disposed for sensing system coolant temperature within system coolant supply line 1434, and to a second isolation valve S2 1492, which in the example depicted, is coupled to coolant return line 1462 coupling air-to-liquid heat exchanger 1460 to system coolant return manifold 1450.

Also note that in the example of FIG. 14, the MCUs operate to transfer heat extracted by the circulating system coolant to the facility chilled coolant. Note also that system coolant flow to the electronic subsystems and the air-to-liquid heat exchanger is in parallel. This flow arrangement advantageously provides a lowest temperature coolant to all of the cooling components in the system. This in turn translates into lowest possible electronic component temperatures within the electronic subsystems, as well as a maximum amount of heat removal from air flowing through the electronics rack by the air-to-liquid heat exchanger, for example, to allow a substantial amount of the heat to be removed prior to returning the air to the computer room environment.

Figure 15:
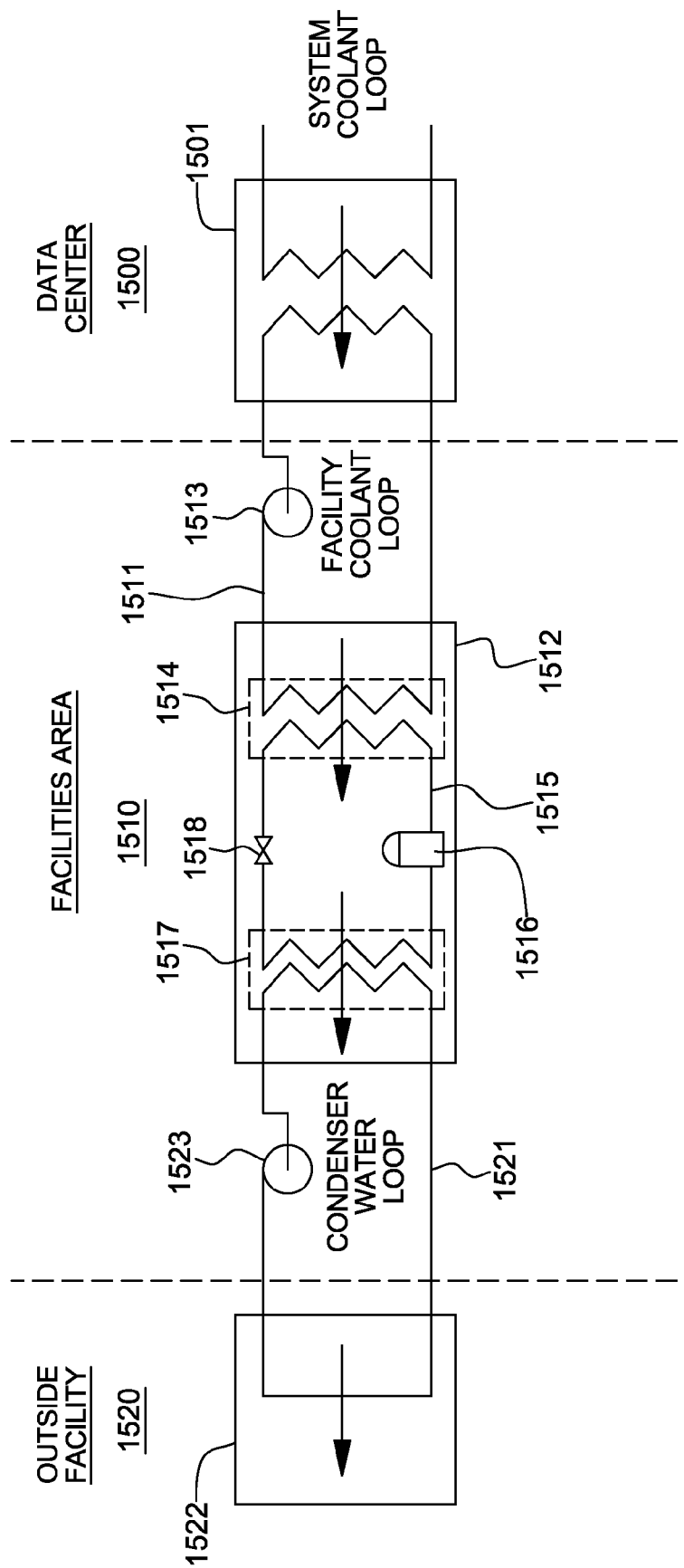
FIG. 15 is a schematic of one embodiment of heat transfer from one or more modular cooling units disposed within one or more electronics racks of a data center to a cooling tower disposed outside of the data center, in accordance with one or more aspects of the present invention.

FIG. 15 is a high-level illustration of one embodiment of heat transfer through a data center cooling system comprising liquid-cooled electronics racks such as described herein. In this embodiment, heat is transferred from one or more electronics racks within a data center 1500 to a facilities area 1510, and ultimately to an area 1520 outside of the facilities area and the data center. Specifically, one or more cooling units, such as modular cooling units (MCUs) 1501, each comprise a liquid-to-liquid heat exchanger for facilitating transfer of heat from system coolant flowing through the associated liquid-cooled electronics rack to a facility coolant loop 1511 disposed (in this embodiment) to transfer heat between MCU 1501 and a refrigeration chiller 1512. A coolant pump 1513 pumps facility coolant through facility coolant loop 1511 to facilitate transfer of heat from the liquid-to-liquid heat exchanger within MCU 1501 to an evaporator 1514 within refrigeration chiller 1512. Evaporator 1514 extracts heat from facility coolant flowing through facility coolant loop 1511 and transfers the heat to a refrigerant flowing through a refrigerant loop 1515. Refrigerant loop 1515 couples in fluid communication evaporator 1514, a compressor 1516, a condenser 1517 and an expansion valve 1518. Refrigeration chiller 1512 implements, in one embodiment, a conventional vapor-compression refrigeration cycle. Condenser 1517 dissipates heat to, for example, a condenser water loop 1521 disposed between refrigeration chiller 1512 and a cooling tower 1522 positioned, for example, outside 1520 facility area 1510 and data center 1500. Heated water is evaporatively cooled within cooling tower 1522 and the cooled water is circulated via a water pump 1523 through condenser 1517 of refrigeration chiller 1512.

Thus, the overall cooling system transfers heat from the IT equipment, i.e., the electronics rack, to the outdoor ambient air. Moving in the direction of heat flow, heat generated within the electronics rack is transferred to the facility coolant loop via the modular cooling unit(s). The facility coolant loop carries the heat to a refrigeration chiller, with the heat being taken into the refrigeration chiller at its evaporator and rejected to a condenser water loop at its condenser. The condenser water passes outside of the facility to, for example, one or more cooling towers that transfer the heat to the outside ambient air.

Figure 16:
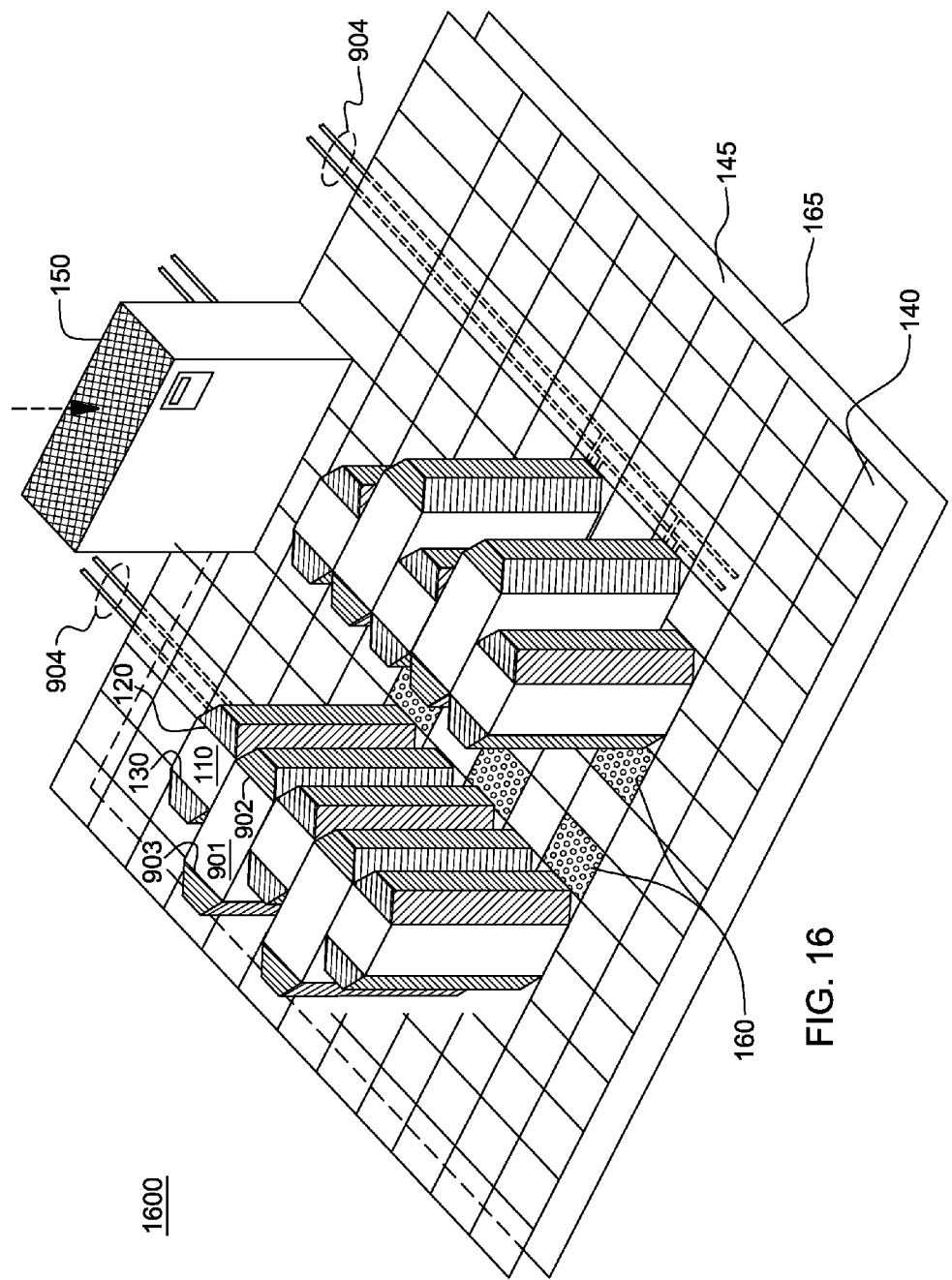
FIG. 16 depicts an alternate embodiment of a heterogeneous data center comprising a plurality of liquid-cooled electronics racks, and a plurality of air-cooled electronics racks, in accordance with one or more aspects of the present invention.

FIG. 16 depicts another embodiment of a data center, generally denoted 1600, in accordance with one or more aspects of the present invention. By way of example, data center 1600 comprises one embodiment of a heterogeneous data center with a plurality of liquid-cooled electronics racks 901, and a plurality of air-cooled electronics racks 110, shown interspersed in rows of data center 1600. Liquid-cooled electronics racks 901 comprise air inlet sides 902 and air outlet sides 903, and air-cooled electronics racks 110 include air inlet sides 120 and air outlet sides 130, with the respective air inlet sides 902, 120 of the liquid-cooled electronics racks 901 and air-cooled electronics racks 110 disposed in a row being aligned to form a cold air aisle of data center 1600. Supply air plenum 145 provides conditioned and cooled air to the air inlet sides of the electronics racks through perforated floor tiles 160 disposed in the cold air aisle of the data center. The supply air plenum 145 is defined between raised floor 140 and base (or sub-floor) 165 of the room, and the conditioned and cooled air is supplied to plenum 145 by one or more air-conditioning units 150, also disposed within data center 1600. Room air is taken into each air-conditioning unit 150 near an upper portion thereof. This room air comprises (in part) exhausted air from the "hot" air aisles of the data center defined at least partially by, for example, the air outlet sides 903, 130 of liquid-cooled electronics racks 901 and air-cooled electronics racks 110. As explained above, liquid-cooled electronics racks 901 each include a cooling apparatus which comprises one or more cooling units, each comprising a liquid-to-liquid heat exchanger coupled in fluid communication to receive chilled facility coolant via a respective facility coolant loop 904. The one or more facility coolant loops may be coupled to a facility chiller unit (not shown) of the data center 1600.

One drawback to the data center configuration illustrated in FIG. 16 is the capital cost and energy use required in including air-conditioning unit(s) 150 within the data center to handle the air cooling requirements of the air-cooled electronics racks 110. FIGS. 17-19C depict an alternate data center embodiment which addresses this drawback by providing multi-rack assemblies, which allow mixed or heterogeneous rack configurations, i.e., liquid-cooled electronics racks and air-cooled electronics racks, to be housed and cooled in a common data center without the use of a separate, dedicated computer room air-conditioning unit.

Figure 17:
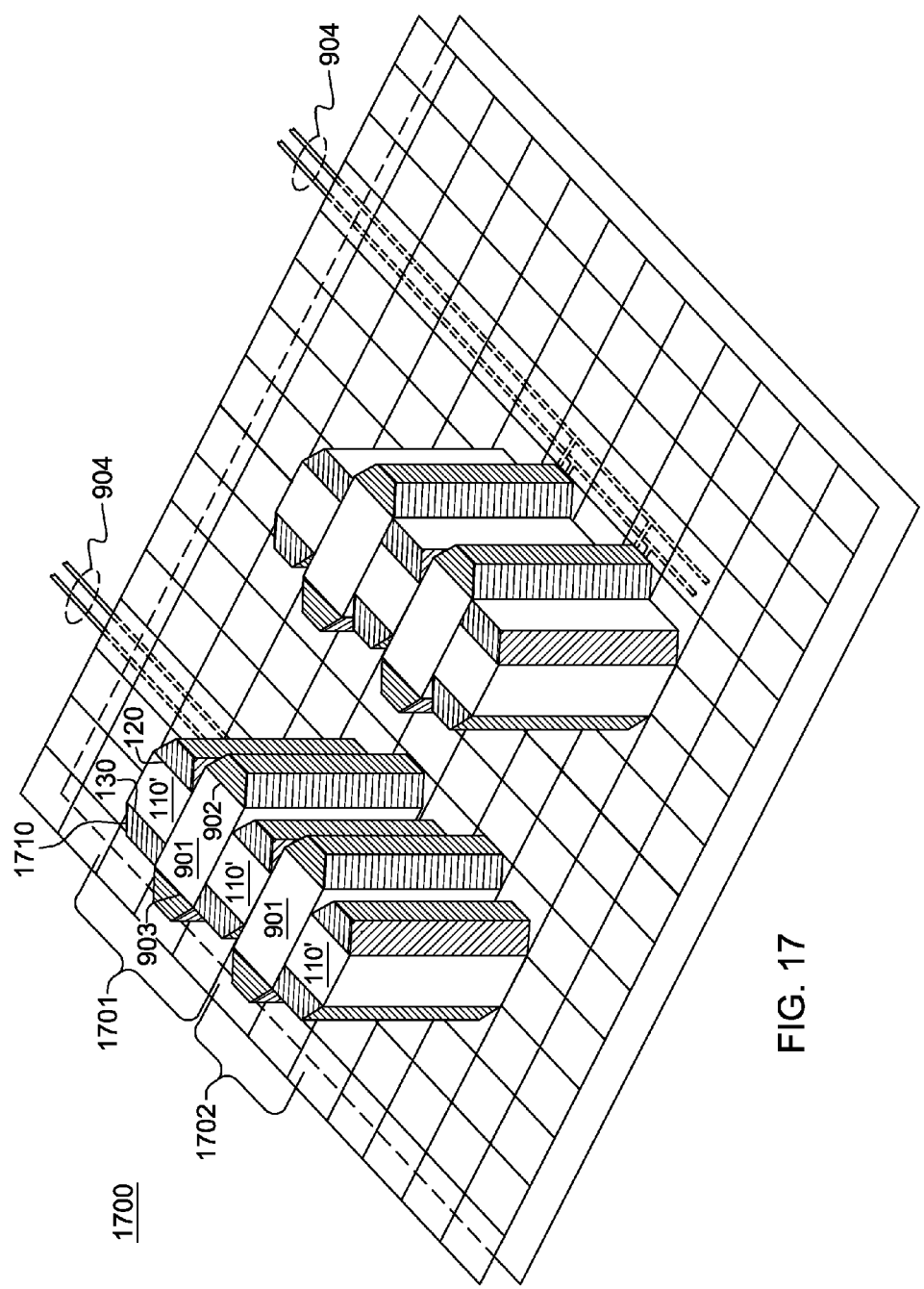
FIG. 17 depicts another embodiment of a heterogeneous data center comprising a plurality of multi-rack assemblies, in accordance with one or more aspects of the present invention.

FIG. 17 depicts one embodiment of a data center 1700 comprising a plurality of multi-rack assemblies 1701, 1702, in accordance with one or more aspects of the present invention. In this embodiment, multi-rack assembly 1701 comprises a liquid-cooled electronics rack 901 servicing two adjacent air-cooled electronics racks 110', and multi-rack assembly 1702 comprises a liquid-cooled electronics rack 901 servicing a single air-cooled electronics rack 110' disposed adjacent to one side thereof. As explained further below, air-cooled electronics racks 110', which may otherwise be similar to air-cooled electronics racks 110 described above, each include (in one embodiment) an airflow director

1710 at the air outlet side thereof. Each airflow director 1710 is configured to facilitate ducting (at least a portion of) air passing through the air-cooled electronics racks 110' to also pass across an air-to-liquid heat exchanger associated with the liquid-cooled electronics rack 901, as explained further below.

Figure 18B:
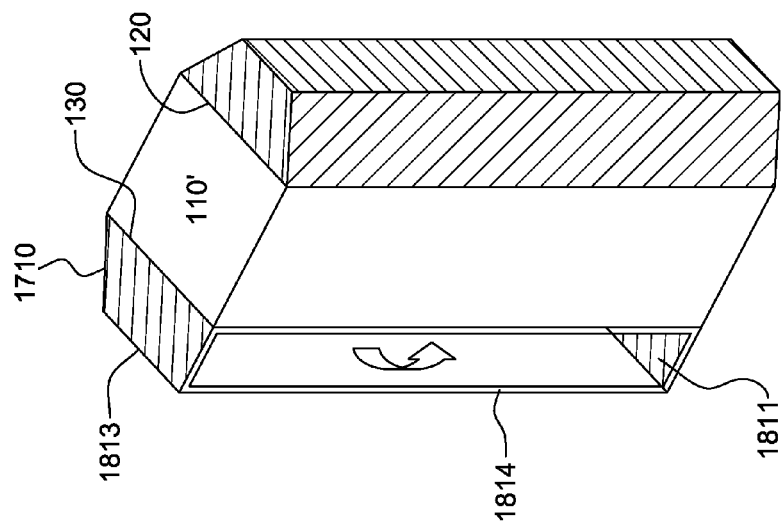
FIG. 18B depicts one embodiment of an air-cooled electronics rack of a multi-rack assembly, in accordance with one or more aspects of the present invention.
Figure 18A:
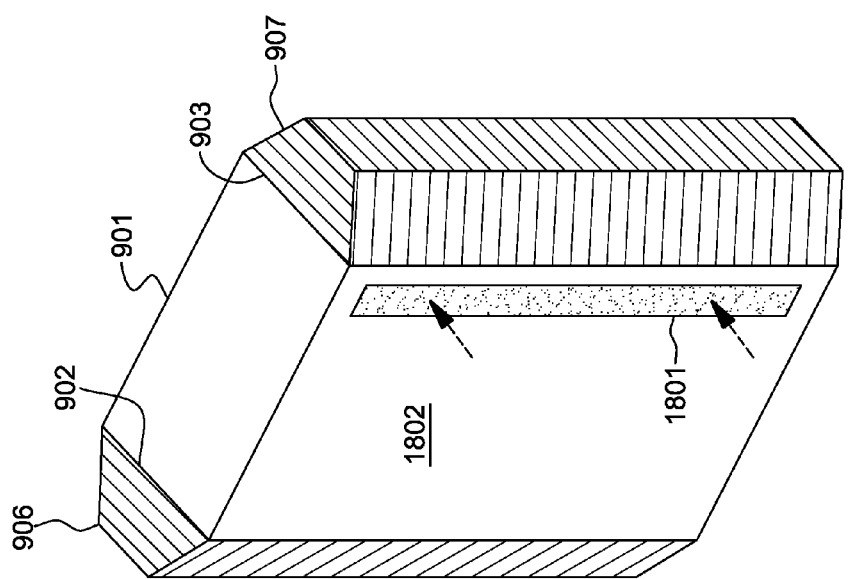
FIG. 18A depicts one embodiment of a liquid-cooled electronics rack of a multi-rack assembly, in accordance with one or more aspects of the present invention.
Figure 18C:
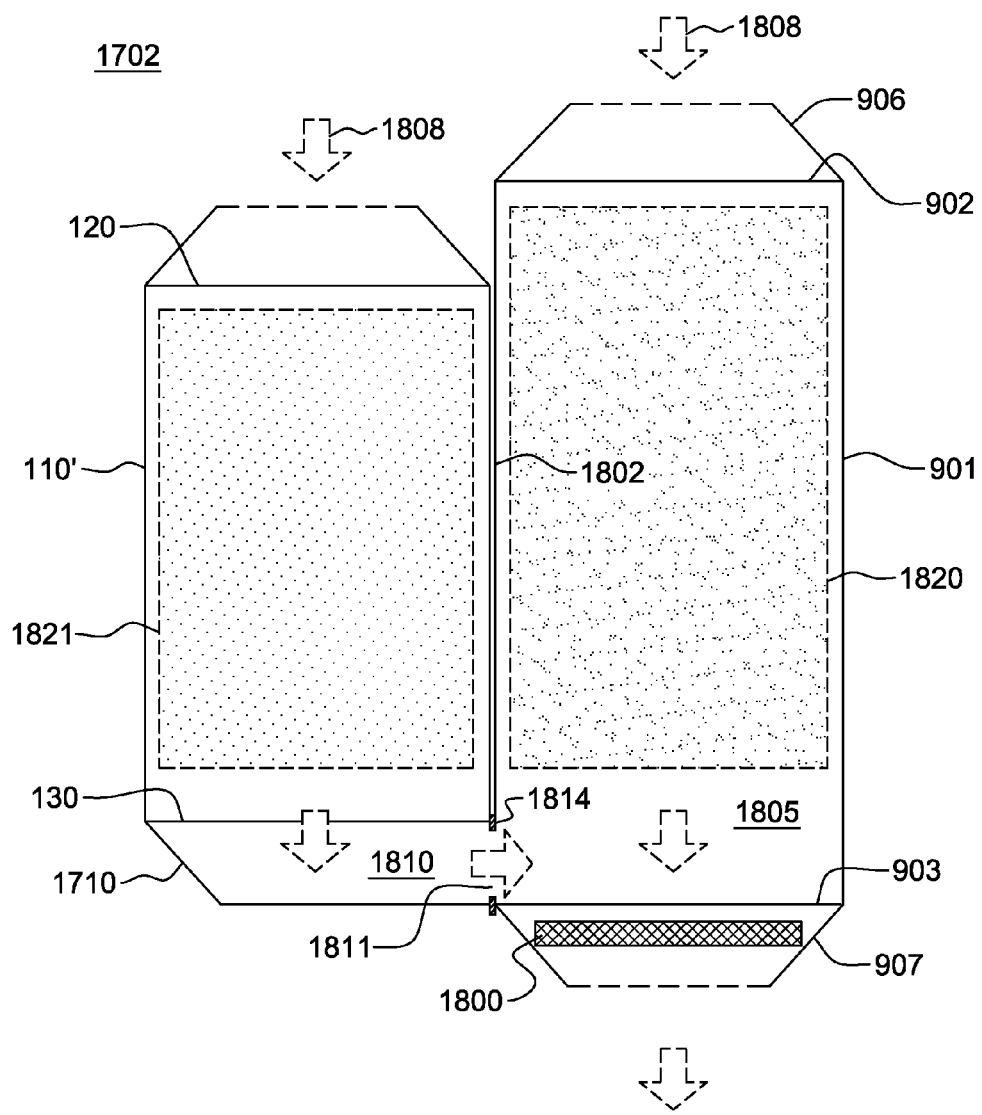
FIG. 18C depicts a schematic of one embodiment of a multi-rack assembly comprising a liquid-cooled electronics rack (such as depicted in FIG. 18A) and an air-cooled electronics rack (such as depicted in FIG. 18B), in accordance with one or more aspects of the present invention.

Referring collectively to FIGS. 18A-18C, one embodiment of a multi-rack assembly 1702 (FIG. 18C) is shown. This multi-rack assembly includes a liquid-cooled electronics rack 901, which comprises an air inlet side 902 and air outlet side 903, each of which may include (in one example) a perforated or louvered rack door 906, 907 (hingedly) mounted to a respective side 902, 903 of electronics rack 901, as illustrated. By way of example, liquid-cooled electronics rack 901 has an air-to-liquid heat exchanger 1800 (FIG. 18C) disposed at the air outlet side 903 thereof (e.g., within rack door 907) for facilitating cooling of air egressing from liquid-cooled electronics rack 901 into the data center. An air intake opening 1801 is provided in a side wall 1802 of liquid-cooled electronics rack 901 coupling the air inlet and air outlet sides 902, 903 thereof, and disposed adjacent to the air-cooled electronic rack 110' of multi-rack assembly 1702.

Note that a single air intake opening 1801 can be provided in one side wall 1802 of the liquid-cooled electronics rack 901 for a multi-rack assembly 1702, and two air intake openings 1801 may be provided in opposing side walls 1802 of a liquid-cooled electronics rack 901 (near the air outlet side 903 thereof) for a multi-rack assembly 1701 comprising a single liquid-cooled electronics rack and two air-cooled electronics racks 110' (as depicted in FIG. 17). Note also that, although shown in side wall 1802, air intake opening 1801 may alternatively reside within rack door 907 mounted to air outlet side 903 of the liquid-cooled electronics rack 901. In such an embodiment, the rack door 907 may be differently configured than illustrated in FIGS. 18A & 18C to provide, for example, a surface parallel to the air-cooled electronics rack 110' or an airflow exhaust opening 1811 in an airflow exhaust plenum 1810 defined by the airflow director 1710 coupled to the air-cooled electronics rack 110'.

The air intake opening 1801 in side wall 1802 of liquid-cooled electronics rack 901 is sized and configured so that airflow exhaust opening 1811 in the adjacently-disposed, air-cooled electronics rack 110' (see FIG. 18C) aligns to the air intake opening 1801. Further, air intake opening 1801 is sized (in one embodiment) so that substantially all air passing through the adjacent air-cooled electronics rack 110' passes through air intake opening 1801 and egresses from the liquid-cooled electronics rack 901 across the associated air-to-liquid heat exchanger 1800 at the air outlet side 903 thereof. Note that although described and depicted herein as residing at the air outlet side, the air-to-liquid heat exchanger 1800 could alternatively be associated with the air inlet side 902 of the liquid-cooled electronics rack 901, in which case, the airflow director 1710 would be disposed at the air inlet side 120 of the air-cooled electronics rack 110'.

Airflow director 1710, illustrated in FIGS. 18B & 18C, includes a substantially solid surface 1813 in opposing relation to air outlet side 130 of air-cooled electronics rack 110'. Together, airflow director 1710 and the air outlet side 130 of electronics rack 110' define airflow exhaust plenum 1810, with airflow exhaust opening 1811 sized and configured to align over or to the air intake opening 1801 in side wall 1802 of liquid-cooled electronics rack 901 when the air-cooled electronics rack 110' is positioned adjacent to liquid-cooled electronics rack 901 as illustrated in FIGS. 17 & 18C. A sealing gasket 1814 may also be provided around airflow exhaust opening 1811 to facilitate ducting of air passing through air-cooled electronics rack 110' through the aligned openings into an exhaust plenum 1805 of liquid-cooled electronics rack 901, as illustrated in FIG. 18C.

As shown in FIG. 18C, the air inlet sides 120, 902 of air-cooled electronics rack 110' and liquid-cooled electronics rack 901 face a first direction, and the air outlet sides 130, 903 face a second, opposite direction. In addition, air-cooled electronics rack 110' is disposed adjacent to side wall 1802 of the liquid-cooled electronics rack 901 so that airflow exhaust opening 1811 of the airflow exhaust plenum 1810 formed between airflow director 1710 and air outlet side 130 of air-cooled electronics rack 110' is aligned to the air intake opening 1801 in side wall 1802 (or, depending upon the size and configuration of the liquid-cooled electronics rack and air-cooled electronics rack, an adjacent side wall opening in the rack door at the air outlet (or air inlet) side of the liquid-cooled electronics rack (not shown)).

In operation, external air 1808 ingresses through openings in, for example, perforated air inlet openings in the rack doors at the air inlet sides 902, 120 of liquid-cooled electronics rack 901 and air-cooled electronics rack 110', respectively, to air-cool one or more electronic components in one or more electronic subsystems 1820, 1821 of the electronics racks 901, 110'. Airflow 1808 egressing from the air outlet side 130 of air-cooled electronics rack 110' passes via the airflow exhaust plenum 1810 through the aligned openings in the exhaust plenum and liquid-cooled electronics rack 901 into exhaust plenum 1805 of liquid-cooled electronics rack 901 for egressing across air-to-liquid heat exchanger 1800 disposed in (for example) an airflow opening in rack door 907 mounted to the air outlet side 903 of liquid-cooled electronics rack 901.

Advantageously, the multi-rack assembly depicted in FIGS. 17-18C facilitates establishing a data center that is 100% liquid-cooled (e.g., water-cooled), notwithstanding the inclusion of one or more air-cooled electronics racks within the data center. In such a data center, there is no need for one or more computer room air-conditioning units, since heat load extracted by air flowing through the air-cooled electronics racks is rejected to the liquid flowing through the air-to-liquid heat exchanger(s) as the air passes across the air-to-liquid heat exchanger(s) of the adjacent liquid-cooled electronics rack(s).

Figure 19A:
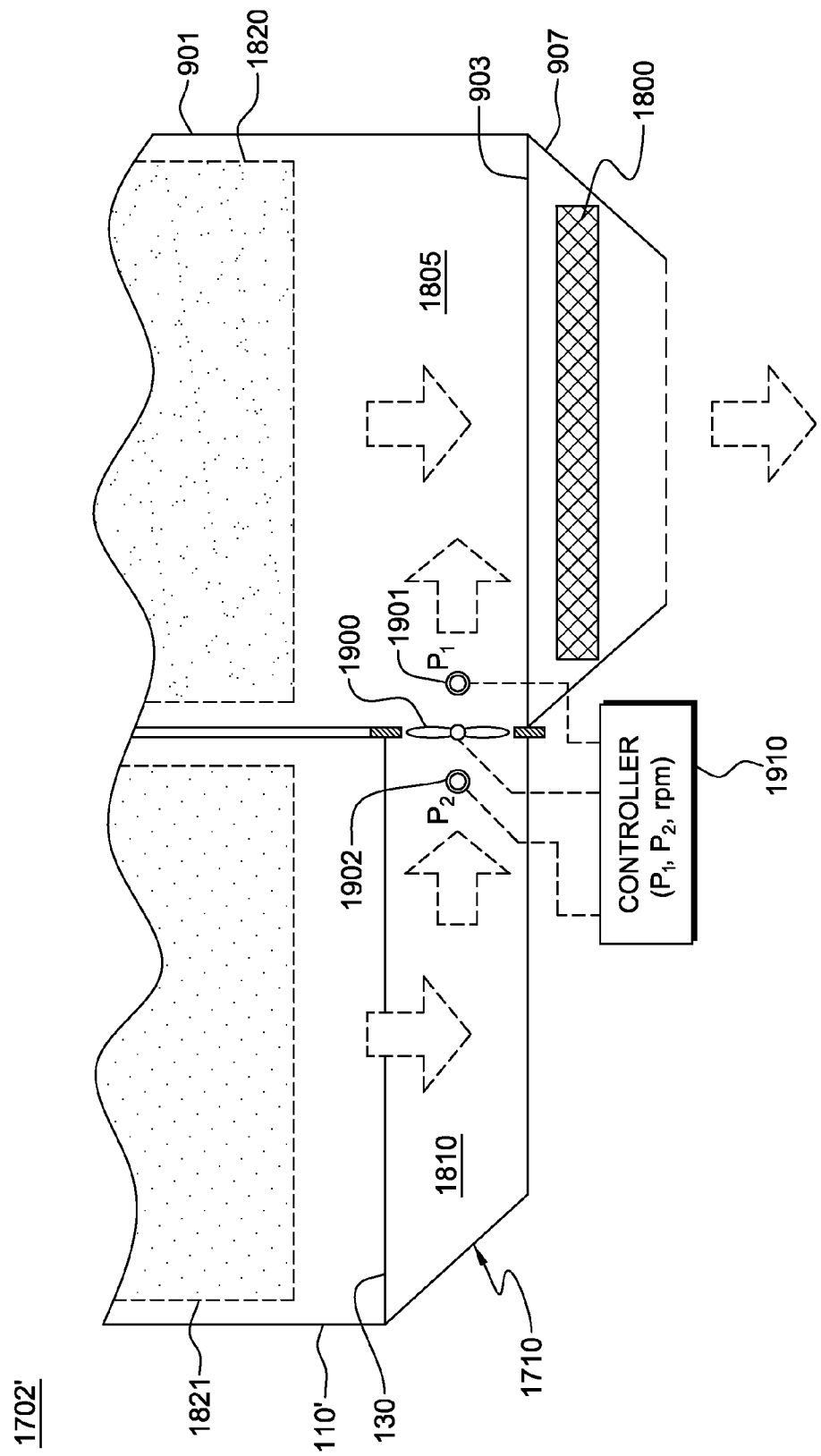
FIG. 19A is a partial schematic of an alternate embodiment of a the multi-rack assembly of FIG. 18C, in accordance with one or more aspects of the present invention.

FIG. 19A is a partial depiction of multi-rack assembly 1702' of FIGS. 17-18C, modified to include one or more air-moving devices (e.g., controllable fans) 1900, one or more air pressure sensors 1901 on a first side of the air-moving device(s), one or more air pressure sensors 1902 on a second side of the air-moving device(s), and a controller 1910, coupled to the one or more air-moving devices 1900, the one or more air pressure sensors 1901, and one or more air pressure sensors 1902, for controlling a state of the air-moving device(s) 1900, as well as rotational speed thereof, to ensure (for example) a positive airflow from the airflow exhaust plenum 1810 at the air outlet side 130 of air-cooled electronics rack 110' to the exhaust plenum 1805 of liquid-cooled electronics rack 901, and hence, across air-to-liquid heat exchanger 1800 in rack door 907 mounted to the air outlet side 903 of liquid-cooled electronics rack 901. In one embodiment, controller 1910 may reside within the multi-rack assembly, for example, within the liquid-cooled electronics rack 901 or the air-cooled electronics rack 110'. Alternatively, controller 1910 may reside remote from the multi-rack assembly. In operation, air-moving device(s) 1900 facilitates airflow through the air-cooled electronics rack 110' for exhausting across the air-to-liquid heat exchanger 1800 of liquid-cooled electronics rack 901. Note that in a further embodiment, one or both of the liquid-cooled electronics rack 901 and air-cooled electronics rack 110' may comprise other air-moving devices associated with the electronic subsystems thereof, as described above.

Figure 19B:
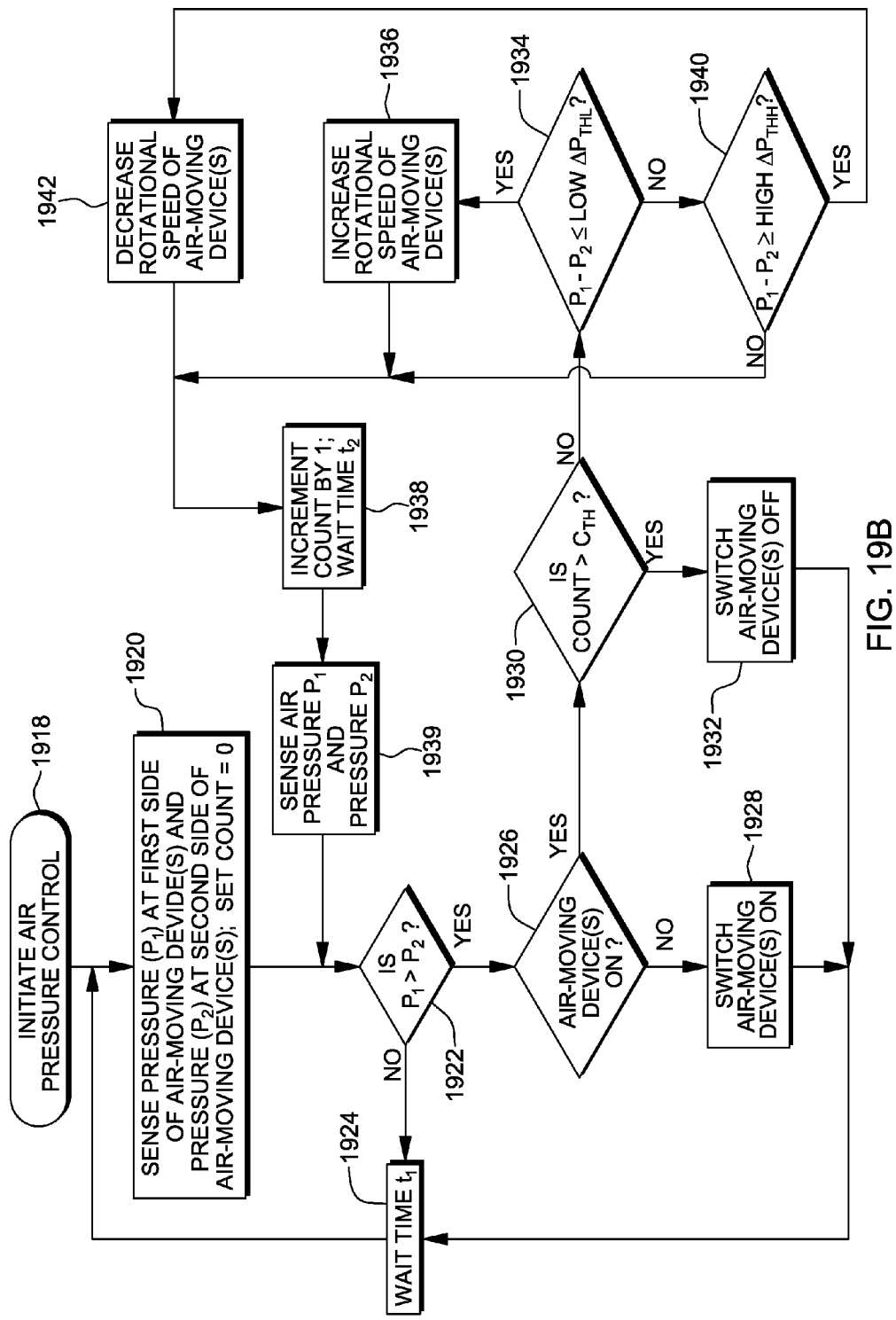
FIG. 19B depicts one embodiment of a process for controlling rotational speed of one or more air-moving devices employed within the multi-rack assembly of FIG. 19A, in accordance with one or more aspects of the present invention.

FIG. 19B depicts one embodiment of a control process implemented by controller 1910 (see FIG. 19A). Air pressure control processing begins 1918 with sensing air pressure $P_1$ at the exhaust plenum 1805 of liquid-cooled electronics rack 901 (as shown in FIG. 19A), and air pressure $P_2$ at the exhaust plenum 1810 of air-cooled electronics rack 110' (FIG. 19A), and sets a Count variable equal to zero 1920 (FIG. 19B). The controller determines whether air pressure $P_1$ is greater than air pressure $P_2$ 1922, and if "no", processing waits a time $t_1$ 1924 before again sensing air pressure $P_1$ and air pressure $P_2$. If air pressure $P_1$ is greater than air pressure $P_2$ 1922, then processing determines whether the one or more air-moving devices are ON 1926, and if "no", the one or more air-moving devices are switched ON 1928, and processing waits time interval $t_1$ 1924 before again sensing air pressure $P_1$ and air pressure $P_2$ 1920.

Assuming that the one or more air-moving devices are already ON 1926, then processing determines whether the Count variable is greater than a count threshold ($C_{TH}$) 1930. If "no", then processing determines whether the pressure differential between $P_1$ and $P_2$ ($P_1-P_2$) is less than or equal to a low pressure differential threshold ($\Delta R_{THL}$) 1934. If "yes", then the controller increases the rotational speed of the air-moving device(s) (e.g., by a set amount) 1936, before incrementing the Count variable by one, waiting a time interval $t_2$ 1938, and then re-sensing air pressure $P_1$ and air pressure $P_2$ 1939, and determining whether air pressure $P_1$ is greater than $P_2$ 1922. If the pressure differential ($P_1-P_2$) is greater than the low pressure differential threshold ($\Delta P_{THL}$) 1934, then the controller determines whether the pressure differential ($P_1-P_2$) is greater than a high pressure differential threshold ($\Delta P_{THH}$) 1940, and if so, the controller decreases the rotational speed of the air-moving device(s) 1942, before incrementing the Count variable by one, and waiting time interval $t_2$ 1938. Alternatively, if the pressure differential ($P_1-P_2$) is less than the high pressure differential threshold ($\Delta P_{THH}$) 1940, then the controller increments the Count variable by one, and waits time interval $t_2$ 1938, before re-sensing air pressure $P_1$ and air pressure $P_2$ 1939, and determining whether air pressure $P_1$ is greater than air pressure $P_2$ 1922.

If air pressure $P_1$ is greater than air pressure $P_2$ 1922, the one or more air-moving devices are ON 1926, and the Count variable is greater than the count threshold ($C_{TH}$) 1930, then the controller switches the one or more air-moving device(s) OFF 1932 before waiting time interval $t_1$ 1924, and again sensing air pressure $P_1$ and air pressure $P_2$, and resetting the Count variable to zero 1920. Note in this regard, that the purpose of the Count variable is to allow the air-moving device(s) to remain on for a set number of counts, for example, for the length of time required for the Count variable to exceed the count threshold ($C_{TH}$), after which the air-moving device(s) are switched off and air pressure $P_1$ and air pressure $P_2$ are again evaluated with the air-moving device(s) in the off state. In this manner, the air-moving device(s) will only remain on while necessary.

Figure 19C:
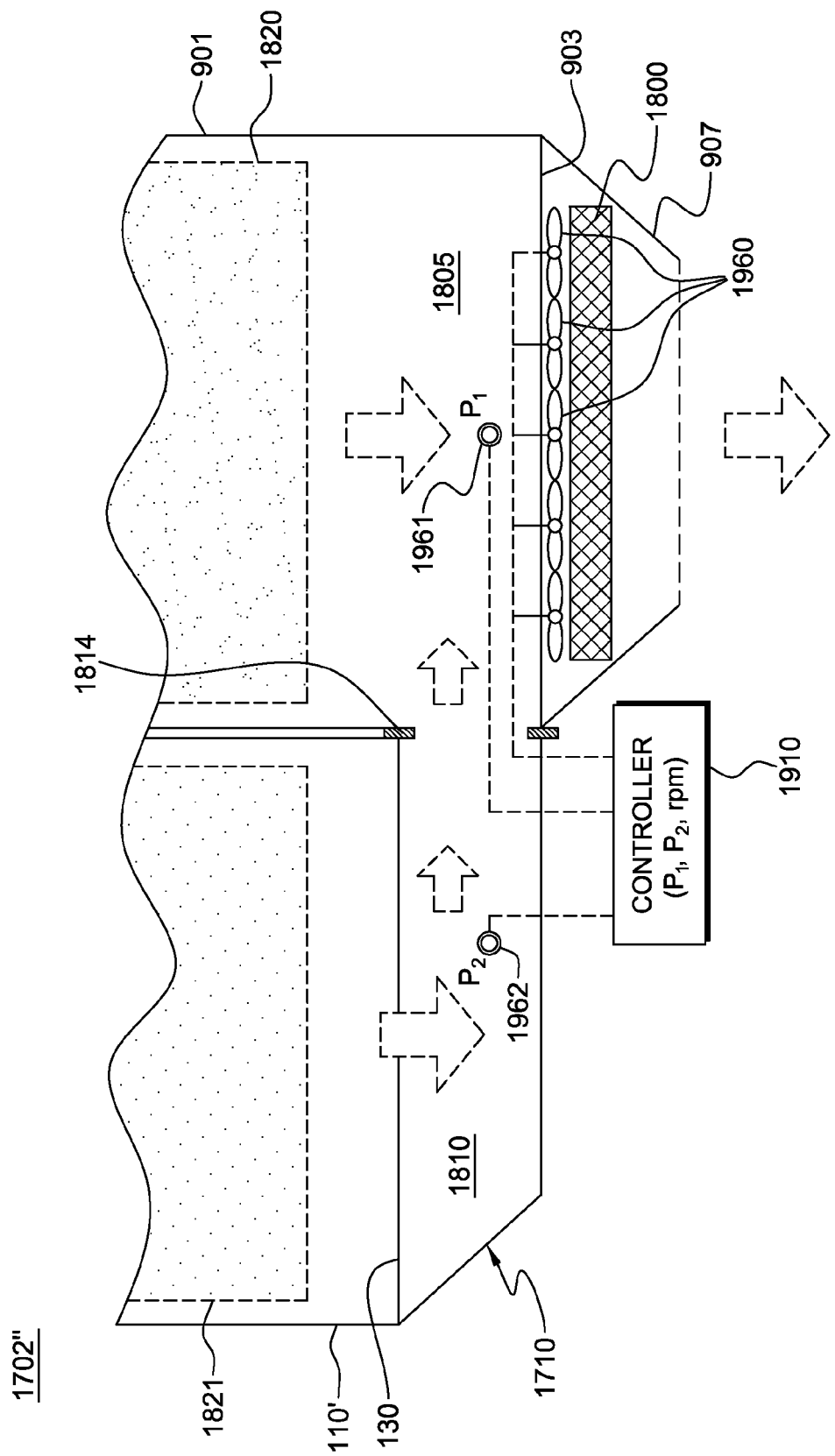
FIG. 19C is a partial schematic of another embodiment of a multi-rack assembly comprising one or more controllable air-moving devices assisting airflow across the air-to-liquid heat exchanger, in accordance with one or more aspects of the present invention.

FIG. 19C depicts another embodiment of a multi-rack assembly 1702", in accordance with one or more aspects of the present invention. This multi-rack assembly is similar to that described above in connection with FIGS. 17-18C, but includes one or more air-moving device(s) (e.g., controllable fans) 1960 at the air outlet side 903 of liquid-cooled electronics rack 901, for example, within the rack door 907 mounted to the air outlet side thereof. One or more air pressure sensors ($P_1$) 1961 and one or more air pressure sensors ($P_2$) 1962 are provided at the rack exhaust plenums 1805, 1810, respectively, for facilitating control of a state of the air-moving device(s) 1960, as well as rotational speed thereof, to ensure (for example) positive airflow from the airflow exhaust plenum 1810 at the air outlet side 130 of air-cooled electronics rack 110' to exhaust plenum 1805 of liquid-cooled electronics rack 901. Controller 1910 is coupled to the air-moving device(s) 1960, as well as to the one or more air pressure sensors 1961, and the one or more air pressure sensors 1962, for controlling activation and deactivation of one or more of the air-moving device(s), as well as rotational speed of one or more of the air-moving devices based on, for example, the sensed pressures. By way of example, the controller could control operation of the air-moving device(s) 1960 in the multi-rack assembly embodiment of FIG. 19C in a manner similar to that described below in connection with the control process of FIG. 19D. Note that, in an alternate embodiment, the one or more air-moving devices 1960 could be located downstream of the rear door heat exchanger 1800.

Figure 19D:
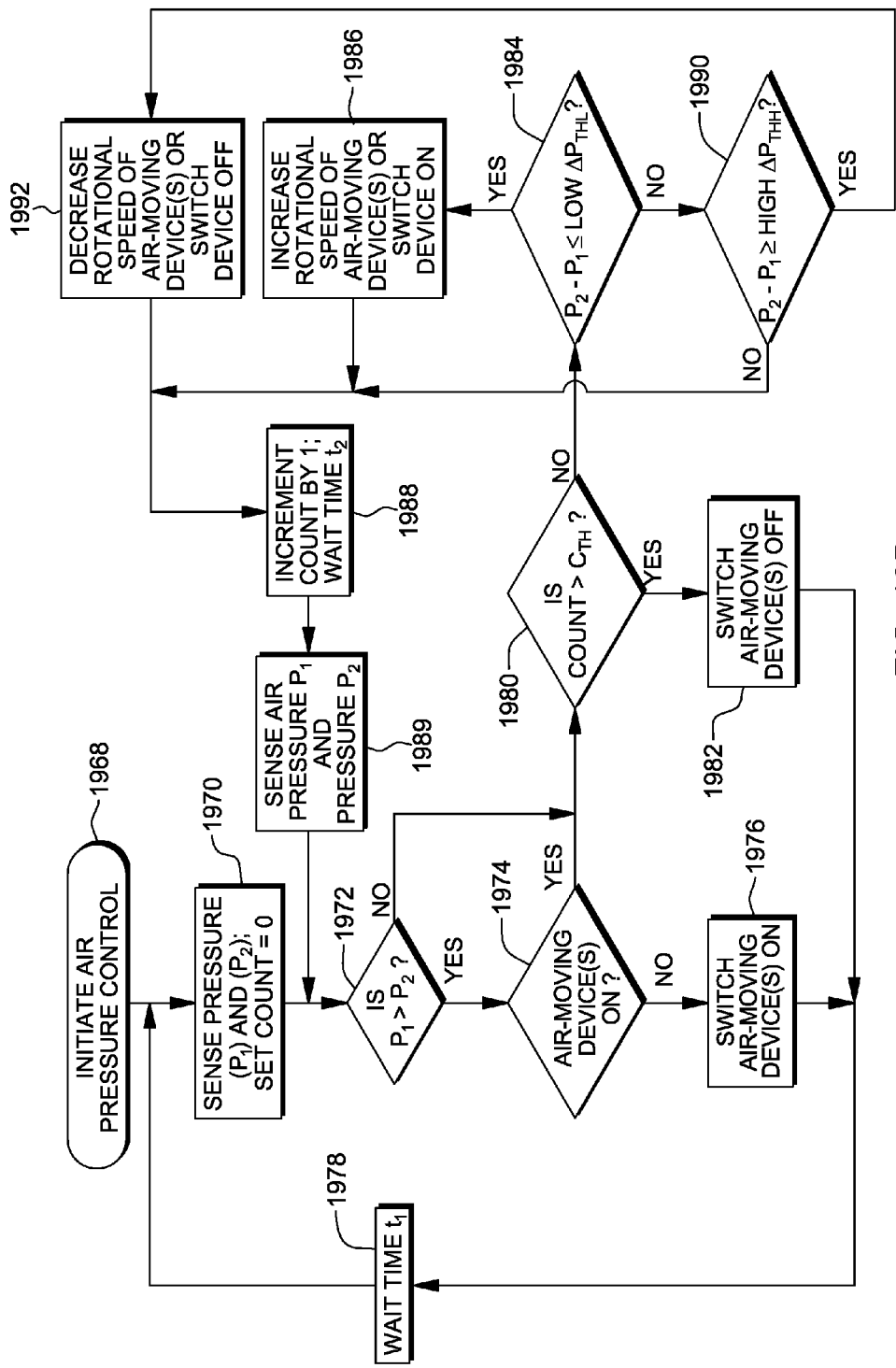
FIG. 19D depicts one embodiment of a process for controlling rotational speed of one or more air-moving devices employed within the multi-rack assembly of FIG. 19C, in accordance with one or more aspects of the present invention.

FIG. 19D depicts one embodiment of a control process implemented by controller 1910 in the multi-rack assembly embodiment of FIG. 19C. In this embodiment, air pressure $P_1$ is again the air pressure at exhaust plenum 1805 (FIG. 19C) of liquid-cooled electronics rack 901, and air pressure $P_2$ is the air pressure at exhaust plenum 1810 of air-cooled electronics rack 110'. Air pressure control processing begins 1968 (FIG. 19D) with sensing air pressure $P_1$ and air pressure $P_2$, and setting the Count variable equal to zero 1970. The controller determines whether air pressure $P_1$ is greater than air pressure $P_2$ 1972, and if "yes", determines whether the one or more air-moving device(s) are on 1974. If "no", then the one or more air-moving device(s) are switched on 1976, and processing waits a time interval $t_1$ 1978 before again sensing air pressure $P_1$ and air pressure $P_2$ 1970.

Assuming that air pressure $P_1$ is less than or equal to air pressure $P_2$ 1972, or if greater than air pressure $P_2$, and the one or more air-moving devices are ON 1974, then processing determines whether the Count variable is greater than a count threshold ($C_{TH}$) 1980. If "no", the controller determines whether the pressure differential between $P_2$ and $P_1$ ($P_2-P_1$) is less than or equal to a low pressure differential threshold ($\Delta P_{THL}$) 1984, and if "yes", then the controller switches the air-moving device(s) on, or increases the rotational speed of the air-moving device(s) (e.g., by a set amount) 1986, before incrementing the Count variable by one, waiting a time interval $t_2$, and re-sensing air pressure $P_1$ and air pressure $P_2$ 1989, and determining whether air pressure $P_1$ is greater than air pressure $P_2$ 1972. If the pressure differential ($P_2-P_1$) is greater than the low pressure differential threshold ($\Delta P_{THL}$) 1984, then the controller determines whether the pressure differential ($P_2-P_1$) is greater than a high pressure differential threshold ($\Delta P-_{THH}$) 1990, and if so, the controller switches the air-moving device(s) off, or decreases the rotational speed of the air-moving device(s) 1992, before incrementing the Count variable by one, and waiting time interval $t_2$ 1988. Alternatively, if the pressure differential ($P_2-P_1$) is less than the high pressure differential threshold ($\Delta P_{THH}$) 1990, then the controller increments the Count variable by one, and waits time interval $t_2$ 1988, before again sensing air pressure $P_1$ and air pressure $P_2$, and determining whether air pressure $P_1$ is greater than air pressure $P_2$.

If air pressure $P_1$ is greater than air pressure $P_2$ 1972, the one or more air-moving device(s) are ON 1974, and the Count variable is greater than the count threshold 1980, then the controller switches the one or more air-moving device(s) OFF 1982 before waiting time interval $t_1$ 1978, and again sensing air pressure $P_1$ and air pressure $P_2$ 1970. Note in this regard that the Count variable is used in a manner similar to that described above in connection with the process control of FIG. 19B.

As will be appreciated by one skilled in the art, control aspects of the present invention may be embodied as a system, method or computer program product. Accordingly, control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible, non-transitory medium that can contain or store a program for use by or in connection with an instruction execution system, apparatus, or device.

In one example, a computer program product includes, for instance, one or more computer readable storage media to store computer readable program code means or logic thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A multi-rack assembly comprising:
a first electronics rack and a second electronics rack, each electronics rack of the first electronics rack and the second electronics rack being at least partially air-cooled and each having an air inlet side, a left side wall and a right side wall relative to the air inlet side, and an air outlet side, wherein the first electronics rack and the second electronics rack are disposed with the right side wall of the first electronics rack directly adjacent to the left side wall of the second electronics rack, or the left side wall of the first electronics rack directly adjacent to the right side wall of the second electronics rack with the air inlet sides facing a first direction and the air outlet sides facing a second direction;

an air-to-liquid heat exchanger associated with the first electronics rack for cooling at least a portion of air passing through the first electronics rack, the air-to-liquid heat exchanger being disposed at and substantially aligned over only the air inlet side or the air outlet side of the first electronics rack and being coupled in fluid communication with a coolant loop to receive coolant therefrom and exhaust coolant thereto, the air-to-liquid heat exchanger transferring heat from air passing thereacross to coolant passing therethrough;

at least one cooling unit associated with the first electronics rack and cooling coolant in the coolant loop to, at least in part, facilitate extraction of heat by the air-to-liquid heat exchanger from air passing thereacross passing through the first electronics rack as well air passing thereacross passing through the second electronics rack; and an airflow director associated with the second electronics rack and configured to facilitate ducting turn at least a portion of air passing through the second electronics rack to also pass across the air-to-liquid heat exchanger aligned over the air inlet side or the air outlet side of the first electronics rack.

2. The multi-rack assembly of claim 1, wherein the second electronics rack comprises a principally air-cooled electronics rack, and wherein the airflow director facilitates ducting substantially all air passing through the second electronics rack to also pass across the air-to-liquid heat exchanger associated with the first electronics rack and aligned over the air inlet side or the air outlet side of the first electronics rack.

3. The multi-rack assembly of claim 1, further comprising a rack door sized and configured to span the one of the air inlet side or the air outlet side of the first electronics rack, the rack door comprising:

a door frame with an airflow opening, the airflow opening facilitating the ingress or egress of airflow through the first electronics rack and the second electronics rack, and wherein the air-to-liquid heat exchanger is disposed so that airflow through the airflow opening in the door frame passes across the air-to-liquid heat exchanger, the air-to-liquid heat exchanger extracting heat from the airflow passing thereacross.

4. The multi-rack assembly of claim 3, wherein the rack door is mounted to the air outlet side of the first electronics rack, and wherein one of the first electronics rack or the rack door further comprises an air intake opening in a side wall thereof disposed adjacent to the second electronics rack, the air intake opening and the airflow director together facilitating ducting of air passing through the second electronics rack to also pass across the air-to-liquid heat exchanger associated with the first electronics rack, 5. The multi-rack assembly of claim 4, wherein the airflow director facilitates defining an airflow exhaust plenum at the air outlet side of the second electronics rack, the airflow exhaust plenum comprising an airflow exhaust opening aligned to the air intake opening in the side wall of the one of the first electronics rack or the rack door.

6. The multi-rack assembly of claim 5, further comprising at least one air-moving device disposed to facilitate positive airflow from the airflow exhaust plenum at the air outlet side of the second electronics rack through the air intake opening in the side wall of the one of the first electronics rack or the rack door, and wherein the multi-rack assembly further comprises a first air pressure sensor, a second air pressure sensor, and a controller, the first air pressure sensor being on a first side of the at least one air-moving device, the second air pressure sensor being on a second side of the at least one air-moving device, and the controller being coupled to the at least one air-moving device, first air pressure sensor and second air pressure sensor to automatically control rotational speed of the at least one air-moving device and ensure positive airflow from the airflow exhaust plenum at the air outlet side of the second electronics rack through the air intake opening in the one of the first electronics rack or the rack door.

7. The multi-rack assembly of claim 5, further comprising a sealing gasket surrounding the airflow exhaust opening of the airflow exhaust plenum at the air outlet side of the second electronics rack and the air intake opening in the one of the side wall of the first electronics rack or the rack door, the sealing gasket facilitating ducting of air passing through the second electronics rack to also pass across the air-to-liquid heat exchanger associated with the first electronics rack.

8. The multi-rack assembly of claim 1, wherein the first electronics rack comprises a liquid-cooled electronics rack, and the second electronics rack an air-cooled electronics rack, and wherein the at least one cooling unit associated with the first electronics rack is configured to provide, via the coolant loop, coolant to at least one liquid-cooled structure in thermal contact with at least one electronic component of the first electronics rack, each cooling unit of the at least one cooling unit comprising a liquid-to-liquid heat exchanger with a first coolant path and a second coolant path therethrough, the first coolant path of each cooling unit receiving chilled facility coolant from a source and passing at least a portion thereof through the liquid-to-liquid heat exchanger, and the second coolant path being coupled in fluid communication with the coolant loop, wherein the liquid-to-liquid heat exchanger expels heat from the coolant in the coolant loop to the chilled facility coolant in the first coolant path.

9. The multi-rack assembly of claim 8, further comprising at least one air-moving device associated with the air-to-liquid heat exchanger, a first air pressure sensor on a first side of the at least one air-moving device, a second air pressure sensor on a second side of the at least one air-moving device, and a controller coupled to the at least one air-moving device, the first air pressure sensor and the second air pressure sensor to automatically control operation of the at least one air-moving device and thus airflow across the air-to-liquid heat exchanger.

10. A data center comprising:

a first electronics rack comprising an air inlet side and an air outlet side respectively enabling ingress and egress of external air;

a second electronics rack comprising an air inlet side and an air outlet side respectively enabling ingress and egress of external air, wherein the second electronics rack and the first electronics rack each comprise a left side wall and a right side wall relative to the air inlet side thereof, and are disposed with the right side wall of the first electronics rack directly adjacent to the left side wall of the second electronics rack, or the left side wall of the first electronics rack directly adjacent to the right side wall of the second electronics rack, with the air inlet sides facing a first direction and the air outlet sides facing a second direction;

a cooling apparatus associated with the first electronics rack, the cooling apparatus facilitating extraction of heat from airflow passing through the first electronics rack, the cooling apparatus comprising:

an air-to-liquid heat exchanger associated with the first electronics rack for cooling at least a portion of air passing through the first electronics rack, the air-to-liquid heat exchanger being disposed at and substantially aligned over only the air inlet side or the air outlet side of the first electronics rack and being coupled in fluid communication with a coolant loop to receive coolant therefrom and exhaust coolant thereto, the air-to-liquid heat exchanger transferring heat from air passing thereacross to coolant passing therethrough; and at least one cooling unit associated with the first electronics rack and cooling coolant in the coolant loop to, at least in part, facilitate extraction of heat by the air-to-liquid heat exchanger from air passing thereacross passing through the first electronics rack as well as air passing thereacross passing through the second electronics rack;

an airflow director associated with the second electronics rack and configured to turn at least a portion of air passing through the second electronics rack to also pass across the air-to-liquid heat exchanger associated with the first electronics rack; and at least one facility coolant loop coupled to the at least one cooling unit associated with the first electronics rack, the at least one facility coolant loop facilitating removal of heat from the coolant in the coolant loop to, at least in part, facilitate extraction of heat by the air-to-liquid heat exchanger from air passing thereacross.

11. The data center of claim 10, wherein the second electronics rack comprises a principally air-cooled electronics rack, and wherein the airflow director facilitates ducting substantially all air passing through the second electronics rack to also pass across the air-to-liquid heat exchanger associated with the first electronics rack and aligned over the air inlet side or the air outlet side of the first electronics rack.

12. The data center of claim 10, farther comprising a rack door sized and configured to span the one of the air inlet side or the air outlet side of the first electronics rack, the rack door comprising:
    a door frame with an airflow opening, the airflow opening facilitating the ingress or egress of airflow through the first electronics rack and the second electronics rack, and wherein the air-to-liquid heat exchanger is disposed so that airflow through the airflow opening in the door frame passes across the air-to-liquid heat exchanger, the air-to-liquid heat exchanger extracting heat from the airflow passing thereacross.

13. The data center of claim 12, wherein the rack door is mounted to the air outlet side of the first electronics rack, and wherein one of the first electronics rack or the rack door further comprises an air intake opening in a side wall thereof disposed adjacent to the second electronics rack, the air intake opening and the airflow director together facilitating ducting of air passing through the second electronics rack to also pass across the air-to-liquid heat exchanger associated with the first electronics rack.

14. The data center of claim 13, wherein the airflow director facilitates defining an airflow exhaust plenum at the air outlet side of the second electronics rack, the airflow exhaust plenum comprising an airflow exhaust opening aligned to the air intake opening in the side wall of the one of the first electronics rack or the rack door.

15. The data center of claim 14, further comprising at least one air-moving device disposed to facilitate positive airflow from the airflow exhaust plenum at the air outlet side of the second electronics rack through the air intake opening in the side wall of the one of the first electronics rack or the rack door, and wherein the multi-rack assembly further comprises a first air pressure sensor, a second air pressure sensor, and a controller, the first air pressure sensor being on a first side of the at least one air-moving device and the second air pressure sensor being on a second side of the at least one air-moving device, and the controller being coupled to the at least one air-moving device, first air pressure sensor and second air pressure sensor to automatically control rotational speed of the at least one air-moving device and ensure positive airflow from the airflow exhaust plenum at the air outlet side of the second electronics rack through the air intake opening in the one of the first electronics rack or the rack door.

16. The data center of claim 14, further comprising a sealing gasket surrounding the airflow exhaust opening of the airflow exhaust plenum at the air outlet side of the second electronics rack and the air intake opening in the one of the side wall of the first electronics rack or the rack door, the sealing gasket facilitating ducting of air passing through the second electronics rack to also pass across the air-to-liquid heat exchanger associated with the first electronics rack.

17. The data center of claim 10, wherein the first electronics rack comprises a liquid-cooled electronics rack, and the second electronics rack an air-cooled electronics rack, and wherein the at least one cooling unit associated with the first electronics rack is configured to provide, via the coolant loop, coolant to at least one liquid-cooled structure is thermal contact with at least one electronic component of the first electronics rack, each cooling unit of the at least one cooling unit comprising a liquid-to-liquid heat exchanger with a first coolant path and a second coolant path therethrough, the first coolant path of each cooling unit receiving chilled facility coolant from a source and passing at least a portion thereof through the liquid-to-liquid heat exchanger, and the second coolant path being coupled in fluid communication with the coolant loop, wherein the liquid-to-liquid heat exchanger expels heat from the coolant in the coolant loop to the chilled facility coolant in the first coolant path.

18. The data center of claim 17, further comprising at least one air-moving device associated with the air-to-liquid heat exchanger, a first air pressure sensor on a first side of the at least one air-moving device, a second air pressure sensor on a second side of the at least one air-moving device, and a controller coupled to the at least one air-moving device, the first air pressure sensor and the second air pressure sensor to automatically control operation of the at least one air-moving device and thus airflow across the air-to-liquid heat exchanger.

\* \* \* \* \*